(12) United States Patent
Wu

(10) Patent No.: US 11,605,557 B2
(45) Date of Patent: Mar. 14, 2023

(54) METHOD FOR PREPARING SEMICONDUCTOR DEVICE WITH METAL PLUG HAVING ROUNDED TOP SURFACE

(71) Applicant: NANYA TECHNOLOGY CORPORATION, New Taipei (TW)

(72) Inventor: Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 14 days.

(21) Appl. No.: 17/520,536

(22) Filed: Nov. 5, 2021

(65) Prior Publication Data
US 2022/0059458 A1 Feb. 24, 2022

Related U.S. Application Data

(62) Division of application No. 16/801,650, filed on Feb. 26, 2020, now Pat. No. 11,239,164.

(51) Int. Cl.
*H01L 21/76* (2006.01)
*H01L 21/768* (2006.01)
(Continued)

(52) U.S. Cl.
CPC ...... *H01L 21/76829* (2013.01); *H01L 23/485* (2013.01); *H01L 23/5226* (2013.01); *H01L 23/5283* (2013.01); *H01L 23/535* (2013.01); *H01L 23/53295* (2013.01); *H01L 27/10808* (2013.01); *H01L 27/10855* (2013.01)

(58) Field of Classification Search
CPC ......... H01L 21/76805; H01L 21/76877; H01L 21/76802; H01L 21/76807; H01L 21/76897; H01L 21/76843; H01L 21/76883; H01L 21/76814; H01L 21/76816; H01L 21/76831; H01L 21/76832; H01L 21/76834; H01L 21/76849; H01L 21/76813; H01L 21/31116; H01L 23/5283; H01L 27/10808; H01L 27/10855; H01L 23/5226; H01L 23/53295; H01L 23/535; H01L 23/485; H01L 23/528; H01L 23/53209; H01L 27/10888; H01L 21/76852; H01L 23/481
See application file for complete search history.

(56) References Cited

U.S. PATENT DOCUMENTS 9,437,540 B2 * 9/2016 Lin ............... H01L 23/5226
10,381,263 B1 * 8/2019 Yang ............ H01L 23/53228
(Continued)

*Primary Examiner* — Shouxiang Hu
(74) *Attorney, Agent, or Firm* — Xuan Zhang

(57) ABSTRACT

A for preparing a semiconductor device includes forming a first dielectric layer over a semiconductor substrate, and forming an etch stop layer over the first dielectric layer. The method also includes forming a second dielectric layer over the etch stop layer, and forming a first metal plug penetrating through the second dielectric layer, the etch stop layer and the first dielectric layer. The first metal plug protrudes from the second dielectric layer. The method further includes performing an anisotropic etching process to partially remove the first metal plug such that the first metal plug has a convex top surface, and forming a third dielectric layer covering the second dielectric layer and the convex top surface of the first metal plug. In addition, the method includes forming a second metal plug over the first metal plug.

8 Claims, 20 Drawing Sheets

(51) Int. Cl.
*H01L 23/528* (2006.01)
*H01L 27/108* (2006.01)
*H01L 23/535* (2006.01)
*H01L 23/485* (2006.01)
*H01L 23/532* (2006.01)
*H01L 23/522* (2006.01)

(56) References Cited

U.S. PATENT DOCUMENTS

| | | | |
|---|---|---|---|
| 10,418,366 B2 * | 9/2019 | Son | H01L 21/76816 |
| 10,714,383 B2 * | 7/2020 | Chen | H01L 21/7684 |
| 10,804,199 B2 * | 10/2020 | Shi | H01L 21/76802 |
| 2016/0155686 A1 * | 6/2016 | Lee | H01L 23/5226 |
| | | | 257/737 |
| 2019/0164887 A1 * | 5/2019 | Wang | H01L 21/76826 |

* cited by examiner

METHOD FOR PREPARING SEMICONDUCTOR DEVICE WITH METAL PLUG HAVING ROUNDED TOP SURFACE

CROSS-REFERENCE TO RELATED APPLICATION

This application is a divisional application of U.S. Non-Provisional application Ser. No. 16/801,650 filed Feb. 26, 2020, which is incorporated herein by reference in its entirety.

TECHNICAL FIELD

The present disclosure relates to a method for preparing a semiconductor device, and more particularly, to a method for preparing a semiconductor device with a metal plug having a rounded top surface.

DISCUSSION OF THE BACKGROUND

Semiconductor devices are essential for many modern applications. With the advancement of electronic technology, semiconductor devices are becoming smaller in size while providing greater functionality and comprising greater amounts of integrated circuitry. Due to the miniaturized scale of semiconductor devices, various types and dimensions of semiconductor devices performing different functions are integrated and packaged into a single module. Furthermore, numerous manufacturing operations are implemented for integration of various types of semiconductor devices.

However, the manufacturing and integration of semiconductor devices involve many complicated steps and operations. An increase in complexity of manufacturing and integration of the semiconductor device may cause deficiencies such as misalignment in interconnect structures. Accordingly, there is a continuous need to improve the structure and the manufacturing process of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a first metal plug and an etch stop layer disposed over a semiconductor substrate. The first metal plug has an upper portion protruding from a top surface of the etch stop layer, and a top surface of the upper portion is rounded. The semiconductor device also includes a second metal plug disposed over the first metal plug. The second metal plug is in direct contact with a first sidewall of the upper portion of the first metal plug and the top surface of the etch stop layer.

In some embodiments, the semiconductor device further includes a first dielectric layer disposed between the semiconductor substrate and the etch stop layer. The first dielectric layer and the etch stop layer surround a lower portion of the first metal plug. In some embodiments, the semiconductor device further includes a second dielectric layer disposed over the etch stop layer. The upper portion of the first metal plug has a second sidewall opposite to the first sidewall, and the second dielectric layer is in direct contact with the second sidewall. In some embodiments, the second dielectric layer is separated from the first sidewall of the upper portion of the first metal plug. In some embodiments, a height of the first sidewall is substantially the same as a height of the second dielectric layer. In some embodiments, the semiconductor device further includes a third dielectric layer disposed over the second dielectric layer. The third dielectric layer partially covers the upper portion of the first metal plug. In some embodiments, the semiconductor device further includes a silicide layer disposed between the first metal plug and the second metal plug. The top surface of the upper portion of the first metal plug is separated from the second metal plug by the silicide layer.

In another embodiment of the present disclosure, a semiconductor device is provided. The semiconductor device includes a first metal plug and a first dielectric layer disposed over a semiconductor substrate. The semiconductor device also includes an etch stop layer disposed over the first dielectric layer. The first metal plug has an upper portion protruding from the etch stop layer, the upper portion has a convex top surface, and the etch stop layer adjoins a lower portion of the first metal plug. The semiconductor device further includes a second dielectric layer disposed over the etch stop layer, and a topmost point of the convex top surface is higher than a top surface of the second dielectric layer. In addition, the semiconductor device includes a second metal plug disposed over the first metal plug. The second metal plug extends to contact a top surface of the etch stop layer.

In some embodiments, the convex top surface is between a first sidewall and a second sidewall of the upper portion of the first metal plug, and the first sidewall is in direct contact with the second metal plug. In some embodiments, the second sidewall of the upper portion of the first metal plug is in direct contact with the second dielectric layer. In some embodiments, the semiconductor device further includes a third dielectric layer disposed over the second dielectric layer, and a silicide layer disposed between the upper portion of the first metal plug and the second metal plug. The silicide layer extends between the convex top surface of the upper portion and the third dielectric layer. In some embodiments, the second metal plug and the second dielectric layer are separated by an air gap. In some embodiments, the semiconductor device further includes a metal-insulator-metal capacitor disposed over the second metal plug. The metal-insulator-metal capacitor is electrically connected to the first metal plug through the second metal plug. In some embodiments, the semiconductor device further includes a bit line disposed over the second metal plug. The bit line is electrically connected to the first metal plug through the second metal plug.

In one embodiment of the present disclosure, a method for preparing a semiconductor device is provided. The method includes forming a first dielectric layer over a semiconductor substrate, and forming an etch stop layer over the first dielectric layer. The method also includes forming a second dielectric layer over the etch stop layer, and forming a first metal plug penetrating through the second dielectric layer, the etch stop layer and the first dielectric layer. The first metal plug protrudes from the second dielectric layer. The method further includes performing an anisotropic etching process to partially remove the first metal plug such that the first metal plug has a convex top surface, and forming a third dielectric layer covering the second dielectric layer and the convex top surface of the first metal plug. In addition, the method includes forming a second metal plug over the first metal plug. The second metal plug penetrates through the third dielectric layer and extends to contact the etch stop layer.

In some embodiments, after the anisotropic etching process is performed, an edge of the convex top surface of the first metal plug is in direct contact with a top surface of the second dielectric layer. In some embodiments, the method further includes performing a silicidation process to form a silicide layer over the convex top surface of the first metal plug before the third dielectric layer is formed. In some embodiments, a portion of the silicide layer is sandwiched between the third dielectric layer and the first metal plug after the second metal plug is formed. In some embodiments, the step of forming the second metal plug further includes forming an opening in the third dielectric layer and forming a gap in the second dielectric layer to partially expose the etch stop layer, and forming the second metal plug in the opening and the gap. The first metal plug has a first sidewall and a second sidewall opposite to the first sidewall, the first sidewall is exposed by the gap, the second sidewall is covered by the second dielectric layer, and the second metal plug is in direct contact with the first sidewall. In some embodiments, the method further includes forming an energy-removable layer between the second metal plug and the third dielectric layer, forming a conductive layer over the second metal plug, and performing a heat treatment process to transform the energy-removable layer into an air gap. The energy-removable layer is covered by the conductive layer.

Embodiments of a semiconductor device and methods for forming the same are provided. The semiconductor device may include a first metal plug and a second metal plug over the first metal plug. Since the first metal plug has a rounded top surface, the contact area between the first metal plug and the second metal plug is increased, and the electric field strength on the rounded top surface of the first metal plug is evenly distributed. As a result, the performance and reliability of the device may be improved. Moreover, the issues caused by misalignment between the first metal plug and the second metal plug may be prevented or reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
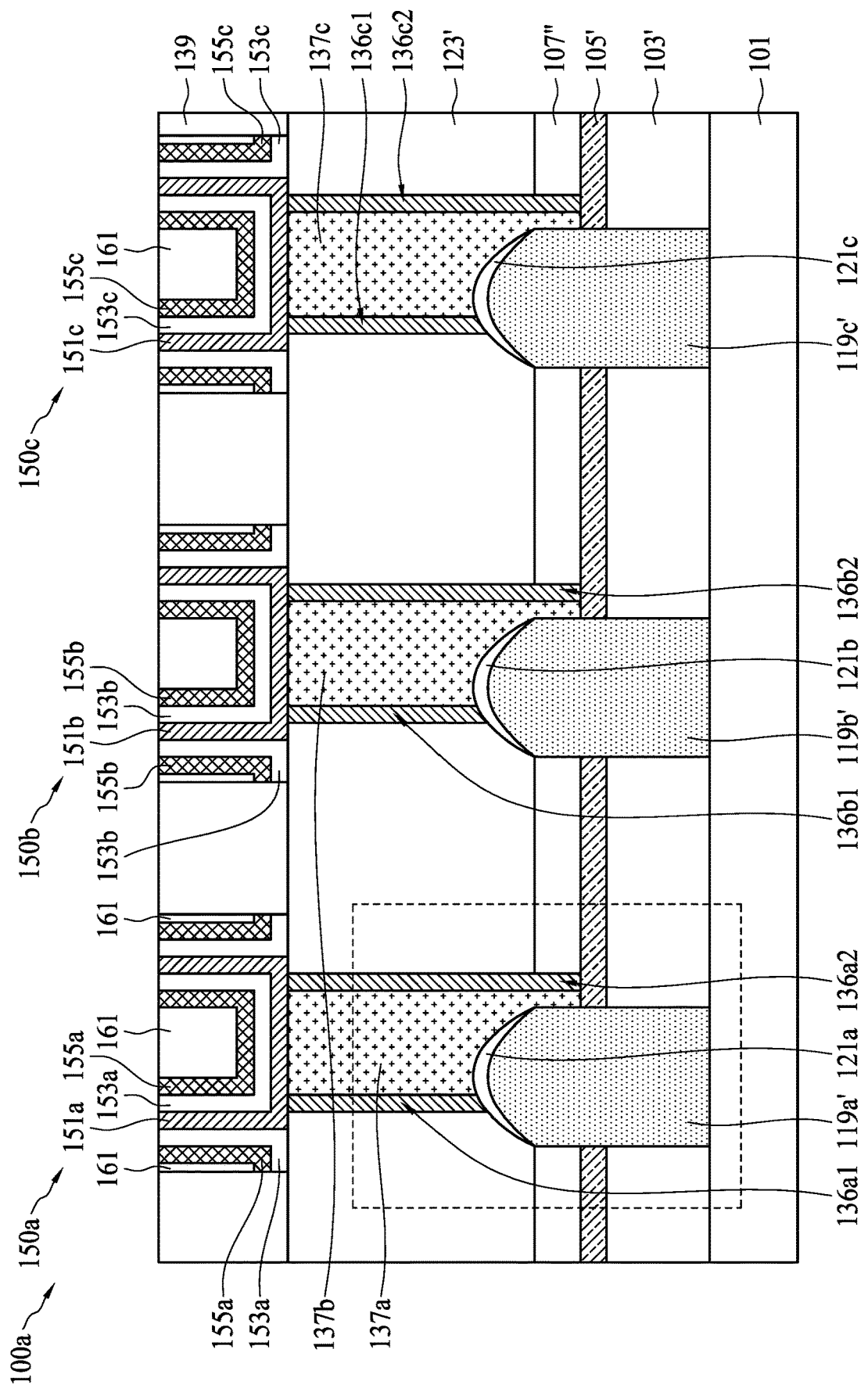
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
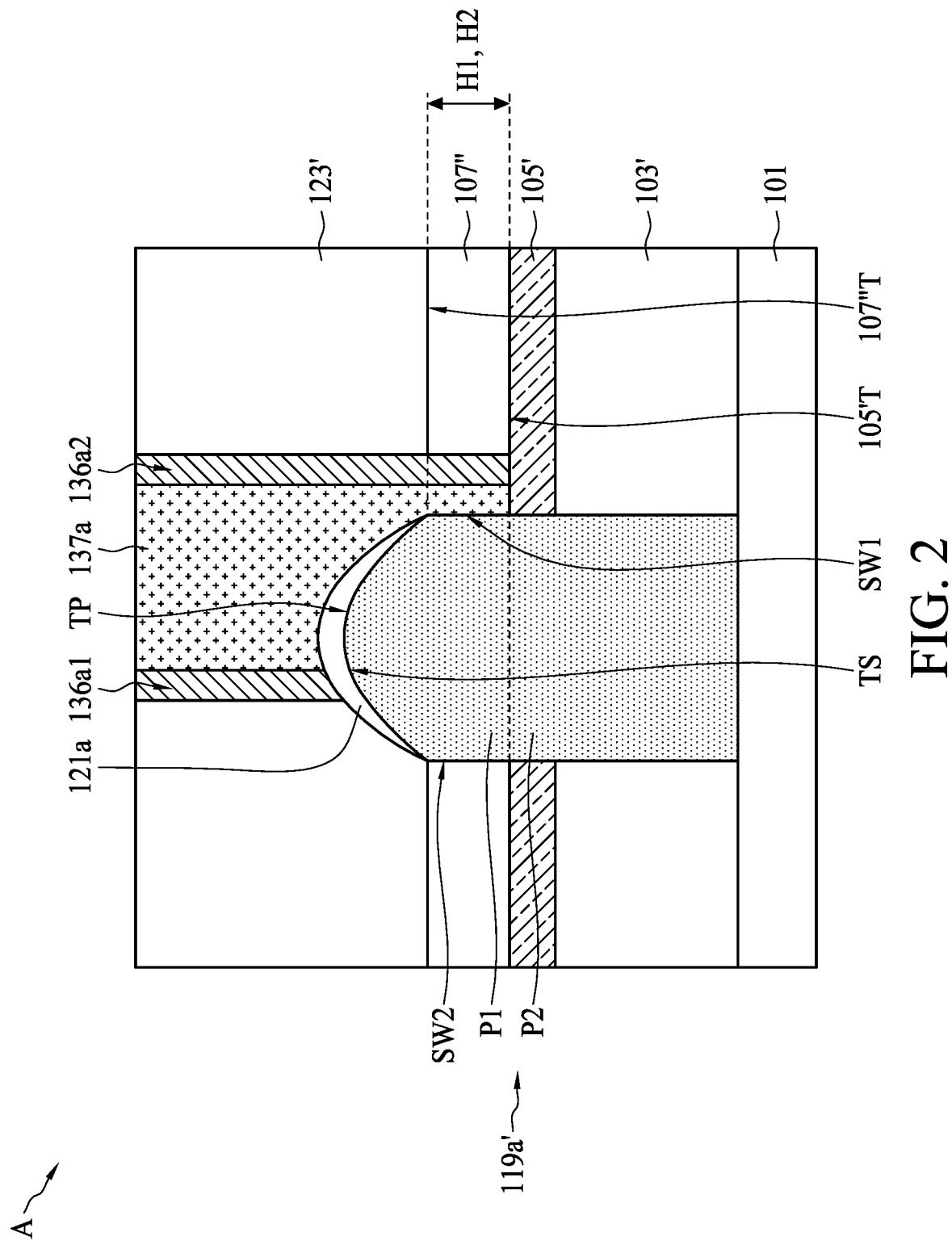
FIG. 2 is a partial enlarged view of region A of FIG. 1, in accordance with some embodiments.

FIG. 1 is a cross-sectional view illustrating a semiconductor device 100a, and FIG. 2 is a partial enlarged view of the region A in the semiconductor device 100a, in accordance with some embodiments. As shown in FIGS. 1 and 2, the semiconductor device 100a includes a first dielectric layer 103' and a plurality of first metal plugs 119a', 119b', 119c' disposed over a semiconductor substrate 101, in accordance with some embodiments. Moreover, in some embodiments, an etch stop layer 105' is disposed over the first dielectric layer 103', and the first metal plugs 119a', 119b' and 119c' protrude from the etch stop layer 103'.

It should be noted that, although only three first metal plugs are illustrated in FIG. 1, the present disclosure is not limited thereto. Depending on the product requirements, the number of first metal plugs in the semiconductor device structure 100a may be less or more than three. Referring to FIG. 2, the first metal plug 119a' has an upper portion P1 protruding from the top surface 105'T of the etch stop layer 105', and a lower portion P2 under the upper portion P1.

In some embodiments, the etch stop layer 105' and the first dielectric layer 103' surround the lower portion P2 of the first metal plug 119a', and the upper portion P1 of the first metal plug 119a' has a rounded (or curved) top surface TS. In some embodiments, the etch stop layer 105' and the first dielectric layer 103' adjoin the sidewalls of the lower portion P2. In some embodiments, the top surface TS of the upper portion P1 is convex, and the top surface TS is between a first sidewall SW1 and a second sidewall SW2 of the upper portion P1.

Moreover, the semiconductor device 100a includes a plurality of second metal plugs 137a, 137b, 137c disposed over the first metal plugs 119a', 119b', 119c', a second dielectric layer 107" disposed over the etch stop layer 105', and a third dielectric layer 123' disposed over the second dielectric layer 107", as shown in FIG. 1 in accordance with some embodiments. In the present embodiment, the semiconductor device 100a includes a plurality of silicide layers 121a, 121b, 121c disposed between the first metal plugs 119a', 119b', 119c' and the second metal plugs 137a, 137b, 137c. By forming the silicide layers 121a, 121b, 121c, the contact resistance between the first metal plugs 119a', 119b', 119c' and the second metal plugs 137a, 137b, 137c may be decreased, thereby improving the performance of the semiconductor device 100a. However, in some other embodiments, the silicide layers 121a, 121b, 121c can be omitted.

Referring to FIG. 2, the second metal plug 137a extends to contact the top surface 105'T of the etch stop layer 105', in accordance with some embodiments. In some embodiments, the first sidewall SW1 of the upper portion P1 of the first metal plug 119a' is in direct contact with the second metal plug 137a, and the second sidewall SW2 of the upper portion P1 of the first metal plug 119a' is in direct contact with the second dielectric layer 107".

It should be noted that the second dielectric layer 107" is separated from the first sidewall SW1, and a height H1 of the first sidewall SW1 is substantially the same as a height H2 of the second dielectric layer 107", in accordance with some embodiments. Within the context of this disclosure, the word "substantially" means preferably at least 90%, more preferably 95%, even more preferably 98%, and most preferably 99%.

More specifically, the top surface TS of the upper portion P1 of the first metal plug 119a' has a topmost point TP, and the topmost point TP is higher than the top surface 107"T of the second dielectric layer 107". That is, the upper portion P1 of the first metal plug 119a' protrudes from the top surface 107"T of the second dielectric layer 107", in accordance with some embodiments.

In addition, the top surface TS of the upper portion P1 of the first metal plug 119a' is separated from the second metal plug 137a by the silicide layer 121a, and the silicide layer 121a extends between the top surface TS and the third dielectric layer 123', in accordance with some embodiments. In other words, the third dielectric layer 123' partially covers the upper portion P1 of the first metal plug 119a', in accordance with some embodiments.

The second metal plugs 137a, 137b, 137c are separated from the second dielectric layer 123' by a plurality of air gaps 136a1, 136a2, 136b1, 136b2, 136c1, 136c2, as shown in FIGS. 1 and 2 in accordance with some embodiments. By forming the air gaps 136a1, 136a2, 136b1, 136b2, 136c1, 136c2, the parasitic capacitance between adjacent second metal plugs may be reduced, thereby improving the operation speed of the semiconductor device 100a. However, in some embodiments, the air gaps 136a1, 136a2, 136b1, 136b2, 136c1, 136c2 can be omitted.

It should be noted that the aforementioned features of the region A in the semiconductor device 100a are similar to, or the same as, features of other regions in the semiconductor device 100a, such as the region including the first metal plug 119b', or the region including the first metal plug 119c'.

Referring to FIG. 1, the semiconductor device 100a further includes a plurality of metal-insulator-metal (MIM)

capacitors 150a, 150b, 150c disposed over the second metal plugs 137a, 137b, 137c, a fourth dielectric layer 139 surrounding the MIM capacitors 150a, 150b, 150c, and a filling dielectric layer 161 filling the space within the MIM capacitors 150a, 150b, 150c, in accordance with some embodiments. It should be noted that the MIM capacitors 150a, 150b, 150c are electrically connected to the first metal plugs 119a', 119b', 119c' through the second metal plugs 137a, 137b, 137c, in accordance with some embodiments.

More specifically, in some embodiments, the MIM capacitor 150a includes a metal layer 151a, an insulating layer 153a and a metal layer 155a. Similarly, the MIM capacitor 150b includes a metal layer 151b, an insulating layer 153b and a metal layer 155b, and the MIM capacitor 150c includes a metal layer 151c, an insulating layer 153c and a metal layer 155c.

In some embodiments, the metal layer 151a is U-shaped, and the second metal plug 137a is covered by the metal layer 151a. Moreover, the metal layer 151a is surrounded by the insulating layer 153a, and the insulating layer 153a is surrounded by the metal layer 155a, as shown in FIG. 1 in accordance with some embodiments. The details of the metal and insulating layers in the MIM capacitors 150b and 150c are similar to, or the same as, those of the MIM capacitor 150a, and descriptions thereof are not repeated herein.

In some embodiments, the filling dielectric layer 161 fills the space within each of the MIM capacitors 150a, 150b, 150c, and the MIM capacitors 150a, 150b, 150c are separated from each other by the fourth dielectric layer 139. In some embodiments, the semiconductor device 100a is a dynamic random access memory (DRAM).

In the semiconductor device 100a, since the first metal plugs 119a', 119b', 119c' have rounded top surfaces, the contact areas between the first metal plugs 119a', 119b', 119c' and the second metal plugs 137a, 137b, 137c (or the contact areas between the silicide layers 121a, 121b, 121c and the second metal plugs 137a, 137b, 137c) are increased, compared with arrangements in which the first metal plugs 119a', 119b', 119c' have flat top surfaces and the second metal plugs 137a, 137b, 137c are perfectly aligned with the first metal plugs 119a', 119b', 119c'. The rounded top surfaces of the first metal plugs 119a', 119b', 119c' may cause a corresponding decrease of the resistances between the first metal plugs 119a', 119b', 119c' and the second metal plugs 137a, 137b, 137c, thereby improving the overall device performance.

Moreover, the electric field strengths on the rounded top surfaces of the first metal plugs 119a', 119b', 119c' are evenly distributed, since the first metal plugs 119a', 119b', 119c' have no sharp portions. Therefore, the lifespan of the semiconductor device 100a may be extended significantly, and the performance and reliability of the device may be improved. Furthermore, since the etch stop layer 105' adjoins sidewalls of the first metal plugs 119a', 119b', 119c', the underlying electronic components can be prevented from being exposed during the processes for forming the second metal plugs 137a, 137b, 137c, and the issues caused by misalignment between the first metal plugs 119a', 119b', 119c' and the second metal plugs 137a, 137b, 137c may be prevented or reduced.

Figure 3:
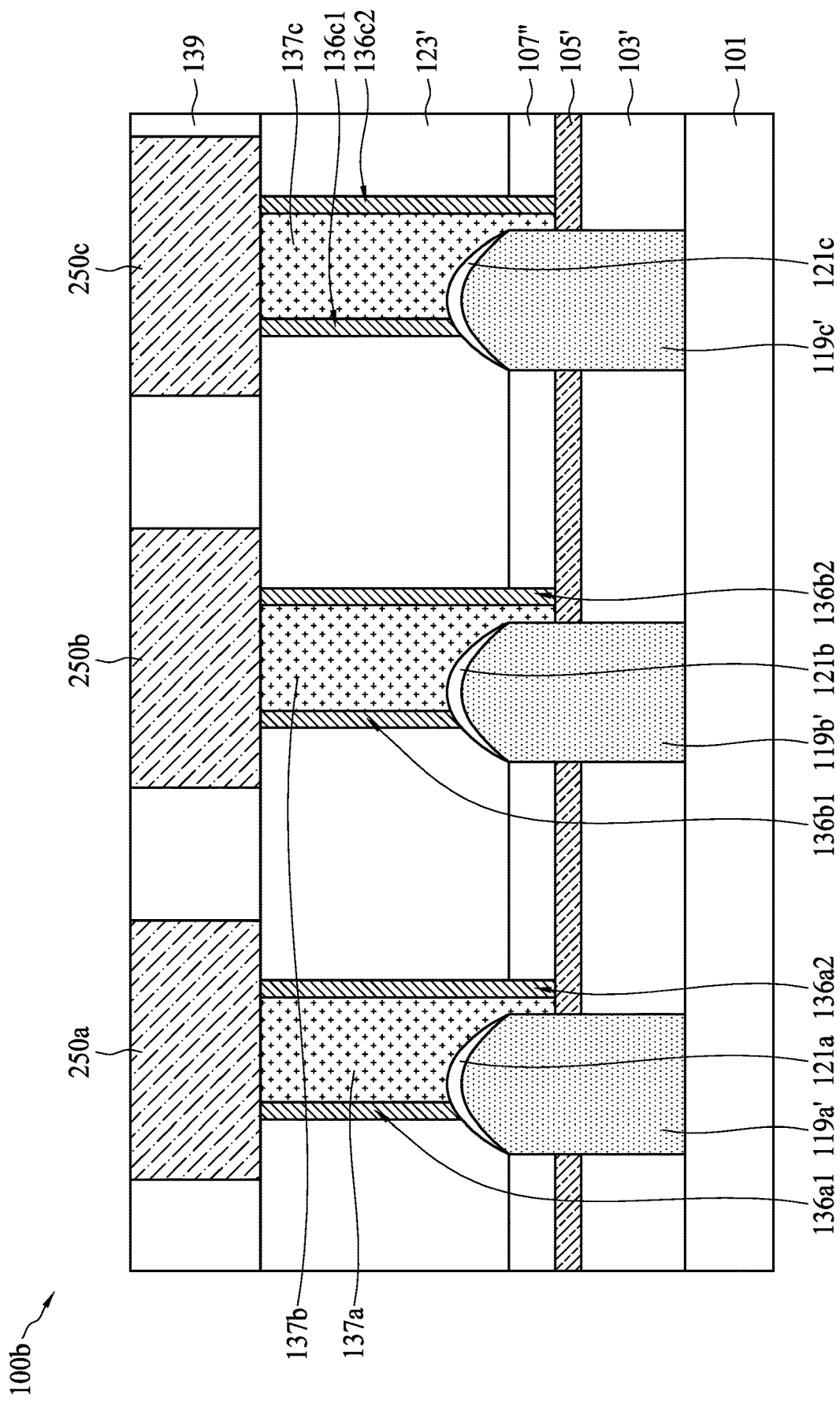
FIG. 3 is a cross-sectional view illustrating a semiconductor device, in accordance with some embodiments.

FIG. 3 is a cross-sectional view illustrating a semiconductor device 100b, which is an alternative embodiment of the semiconductor device 100a, in accordance with some embodiments. For reasons of consistency and clarity, similar components appearing in both FIGS. 1 and 3 will be labeled the same.

One difference between the embodiment shown in FIG. 3 and the embodiment shown in FIG. 1 is that the MIM capacitors 150a, 150b, 150c are replaced by a plurality of bit lines 250a, 250b, 250c in the embodiment shown in FIG. 3. It should be noted that the bit lines 250a, 250b, 250c are electrically connected to the first metal plugs 119a', 119b', 119c' through the second metal plugs 137a, 137b, 137c, in accordance with some embodiments.

Figure 4:
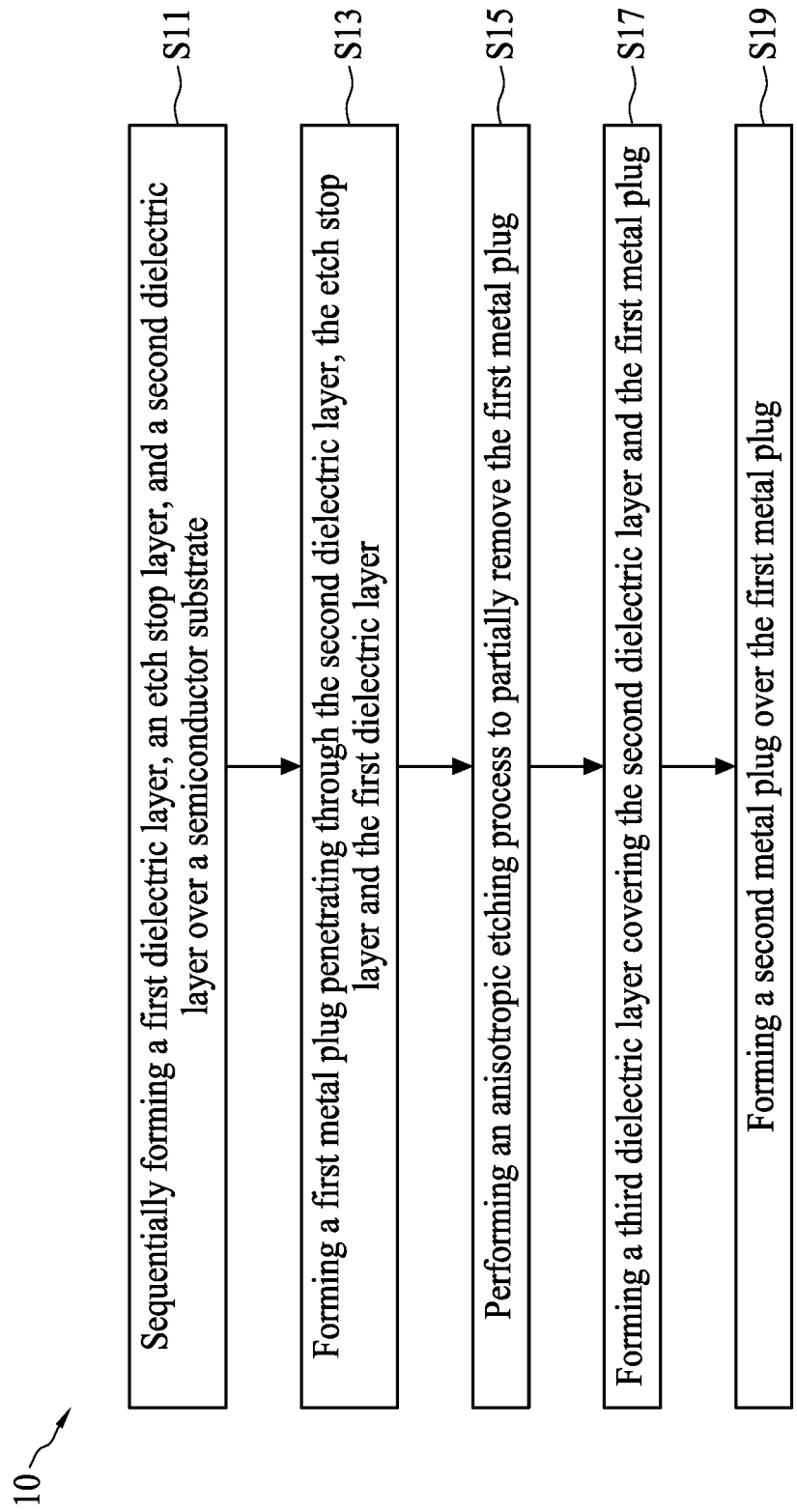
FIG. 4 is a flow diagram illustrating a method of forming a semiconductor device, in accordance with some embodiments.

FIG. 4 is a flow diagram illustrating a method 10 of forming the semiconductor device 100a or 100b, and the method 10 includes steps S11, S13, S15, S17 and S19, in accordance with some embodiments. The steps S11 to S19 of FIG. 4 are elaborated in connection with other figures of the present disclosure, which are cross-sectional views illustrating sequential intermediate stages in the formation of the semiconductor device 100a or 100b, in accordance with some embodiments.

Figure 5:
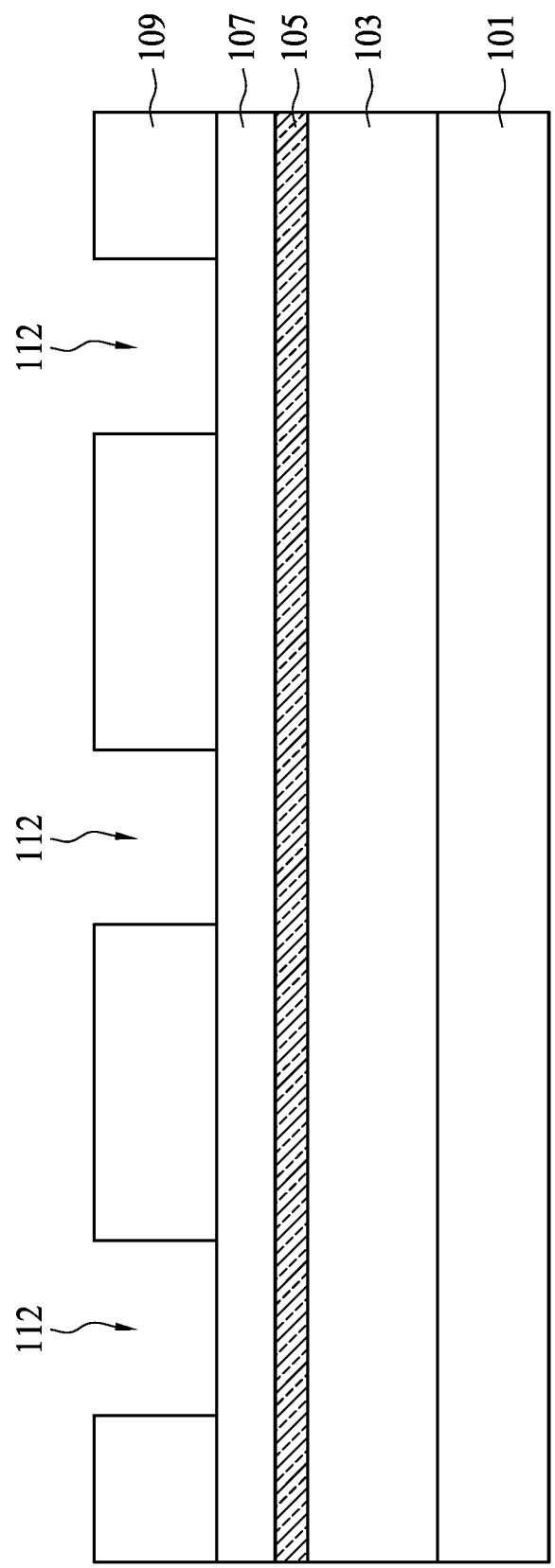
FIG. 5 is a cross-sectional view illustrating an intermediate stage for forming a photoresist pattern in the formation of a semiconductor device, in accordance with some embodiments.

As shown in FIG. 5, the semiconductor substrate 101 is provided. The semiconductor substrate 101 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin field-effect transistors (FinFETs), other suitable IC components, or combinations thereof.

Depending on the IC fabrication stage, the semiconductor substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). The semiconductor substrate 101 has been simplified for the sake of clarity. It should be noted that additional features can be added in the semiconductor substrate 101, and some of the features described below can be replaced, modified, or eliminated in other embodiments.

In some embodiments, the first dielectric layer 103, the etch stop layer 105, and the second dielectric layer 107 are sequentially disposed over the semiconductor substrate 101. The respective step is illustrated as the step S11 in the method 10 shown in FIG. 4.

In some embodiments, the first dielectric layer 103 is made of silicon oxide, silicon carbide, silicon nitride, silicon oxynitride, another suitable material, or a combination thereof, and the first dielectric layer 103 is formed by a deposition process, such as a chemical vapor deposition (CVD) process, a physical vapor deposition (PVD) process, an atomic layer deposition (ALD) process, a spin-on process, or another suitable process.

Some materials and processes used to form the etch stop layer 105 and the second dielectric layer 107 are similar to, or the same as, those used to form the first dielectric layer 103, and descriptions thereof are not repeated herein. It should be noted that the material of the etch stop layer 105 is different from the material of the second dielectric layer 107, in accordance with some embodiments.

After the second dielectric layer 107 is formed, a photoresist pattern 109 with openings 112 is disposed over the second dielectric layer 107, and the second dielectric layer 107 is exposed by the openings 112, as shown in FIG. 5 in accordance with some embodiments. In some embodiments, the photoresist pattern 109 may be formed by a deposition process and a patterning process.

The deposition process for forming the photoresist pattern 109 may include a CVD process, a high-density plasma chemical vapor deposition (HDPCVD) process, a spin-on process, or another suitable process. The patterning process for forming the photoresist pattern 109 may include a photolithography process. The photolithography process may include photoresist coating (e.g., spin coating), soft baking, mask aligning, exposure, post-exposure baking, developing the photoresist, rinsing and drying (e.g., hard baking).

Figure 6:
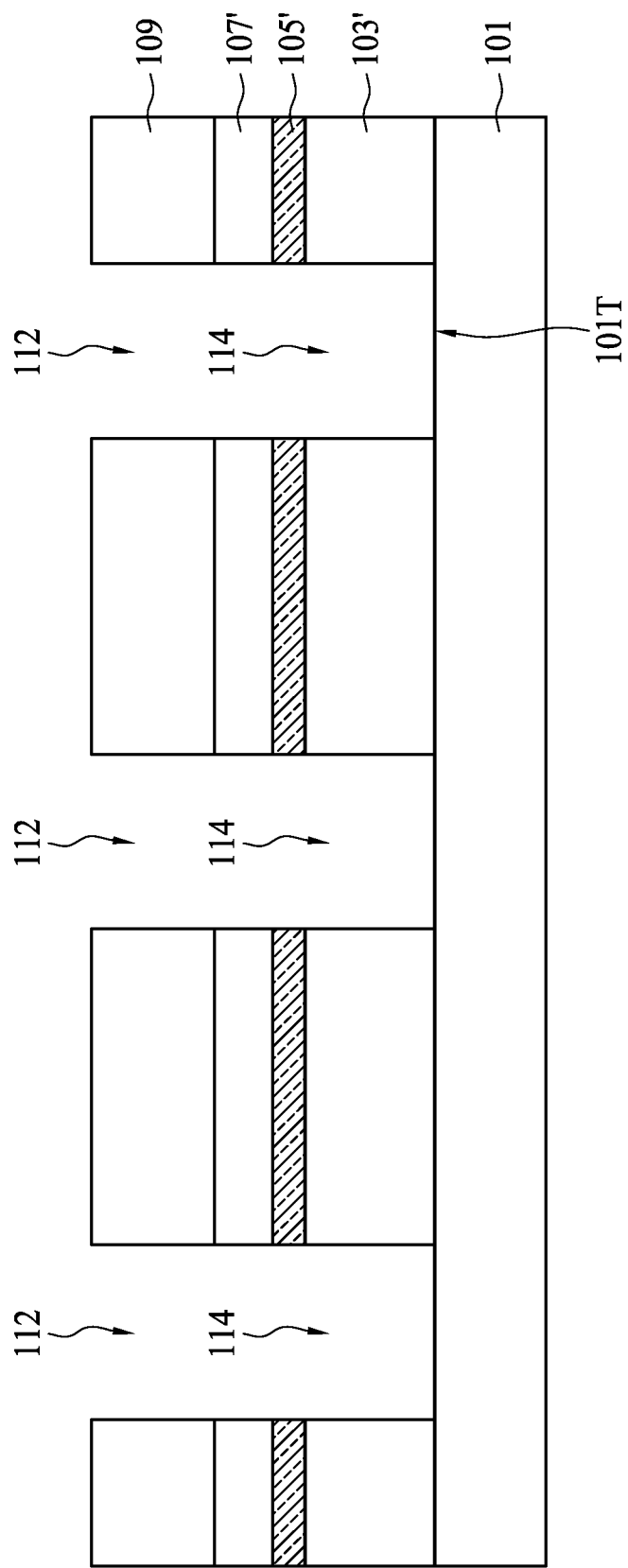
FIG. 6 is a cross-sectional view illustrating an intermediate stage for forming openings in the formation of a semiconductor device, in accordance with some embodiments.

Next, an etching process is performed on the structure by using the photoresist pattern 109 as a mask, as shown in FIG. 6 in accordance with some embodiments. It should be noted that the etching process is performed until the top surface 101T of the semiconductor substrate 101 is exposed, and openings 114 are formed under the openings 112.

After the etching process, the openings 114 are surrounded by the remaining second dielectric layer 107', the remaining etch stop layer 105' and the remaining first dielectric layer 103'. The etching process may be a dry etching process, a wet etching process, or a combination thereof.

Figure 7:
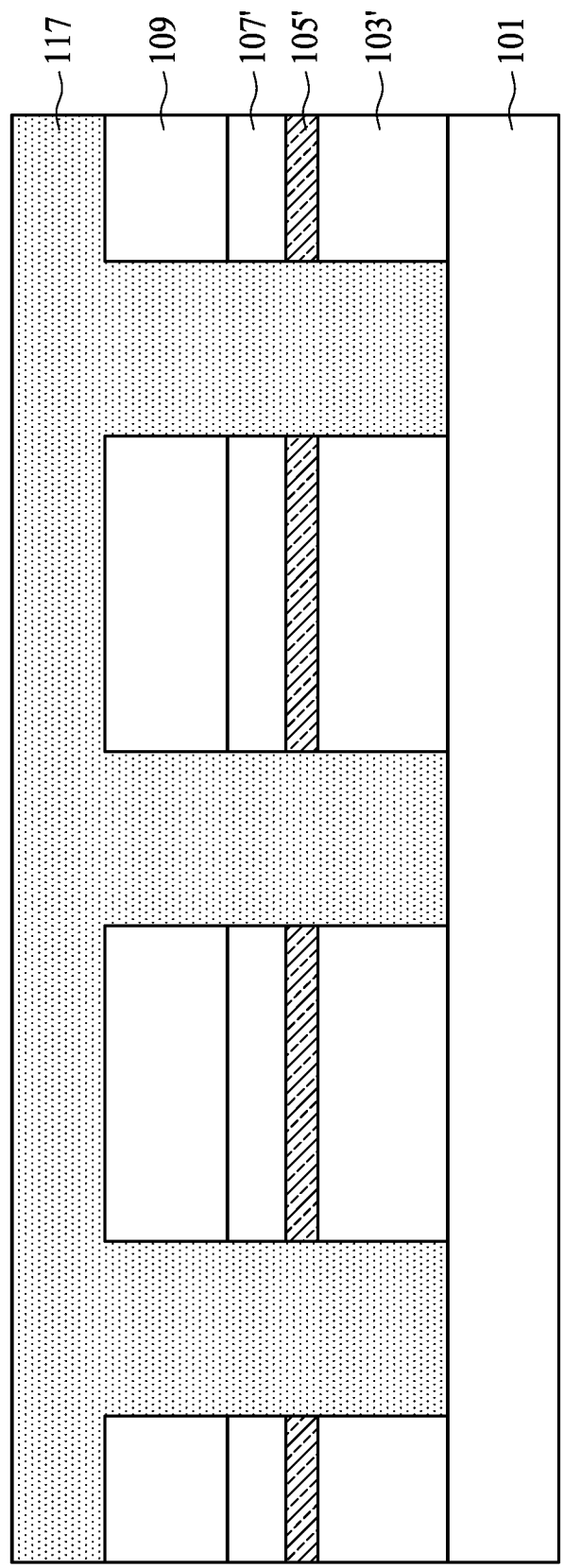
FIG. 7 is a cross-sectional view illustrating an intermediate stage for forming a metal layer in the formation of a semiconductor device, in accordance with some embodiments.

After the openings 114 are formed, a metal layer 117 is deposited to fill the openings 114, as shown in FIG. 7 in accordance with some embodiments. More specifically, the openings 114 are entirely filled by the metal layer 117, and the metal layer 117 extends onto the photoresist pattern 109, in accordance with some embodiments.

In some embodiments, the metal layer 117 is made of copper (Cu). In some other embodiments, the metal layer 117 is made of tungsten (W), cobalt (Co), titanium (Ti), aluminum (Al), tantalum (Ta), or another applicable material. Moreover, in some embodiments, the metal layer 117 is formed by a CVD process, a PVD process, an ALD process, a plating (e.g., electroplating) process, a sputtering process, or another suitable process.

Figure 8:
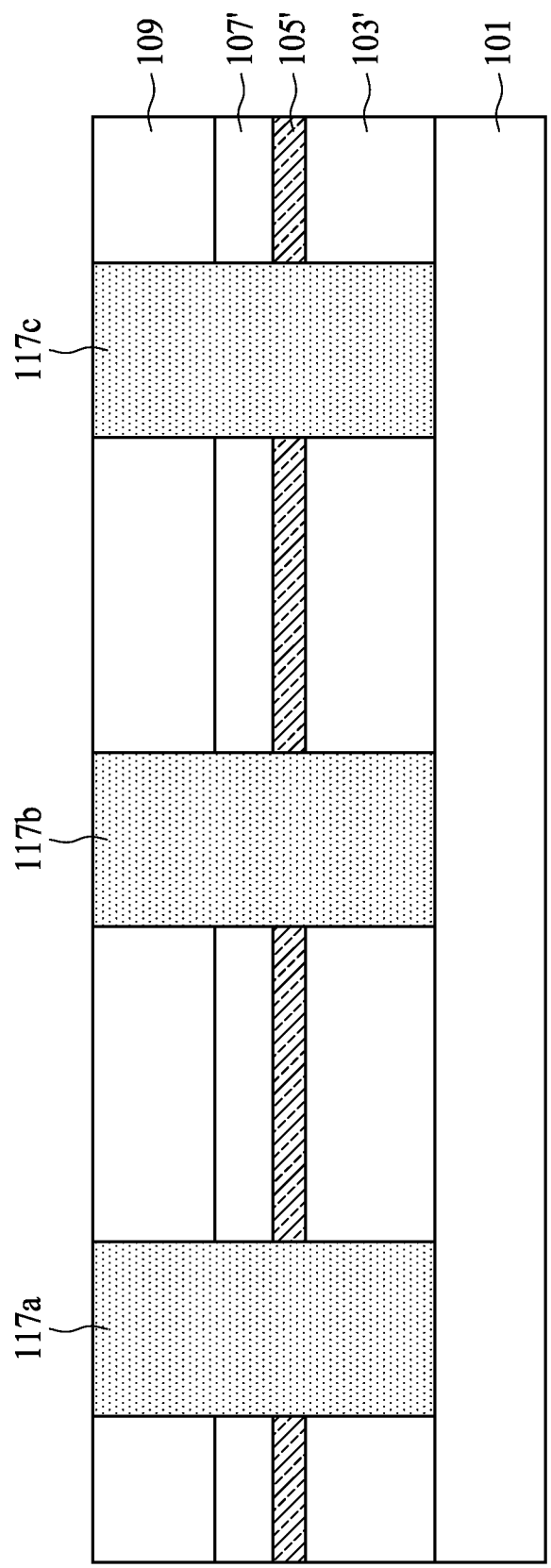
FIG. 8 is a cross-sectional view illustrating an intermediate stage for forming metal portions in the formation of a semiconductor device, in accordance with some embodiments.

Next, excess portions of the metal layer 117 are removed to form metal portions 117a, 117b, 117c, as shown in FIG. 8 in accordance with some embodiments. More specifically, the portions of the metal layer 117 covering the photoresist pattern 109 are removed, and the portions of the metal layer 117 deposited into the openings 112 and 114 remain, in accordance with some embodiments.

In some embodiments, the removal of the excess portions of the metal layer 117 is performed by a planarization process or an etching process. The planarization process may be a chemical mechanical polishing (CMP) process.

Figure 9:
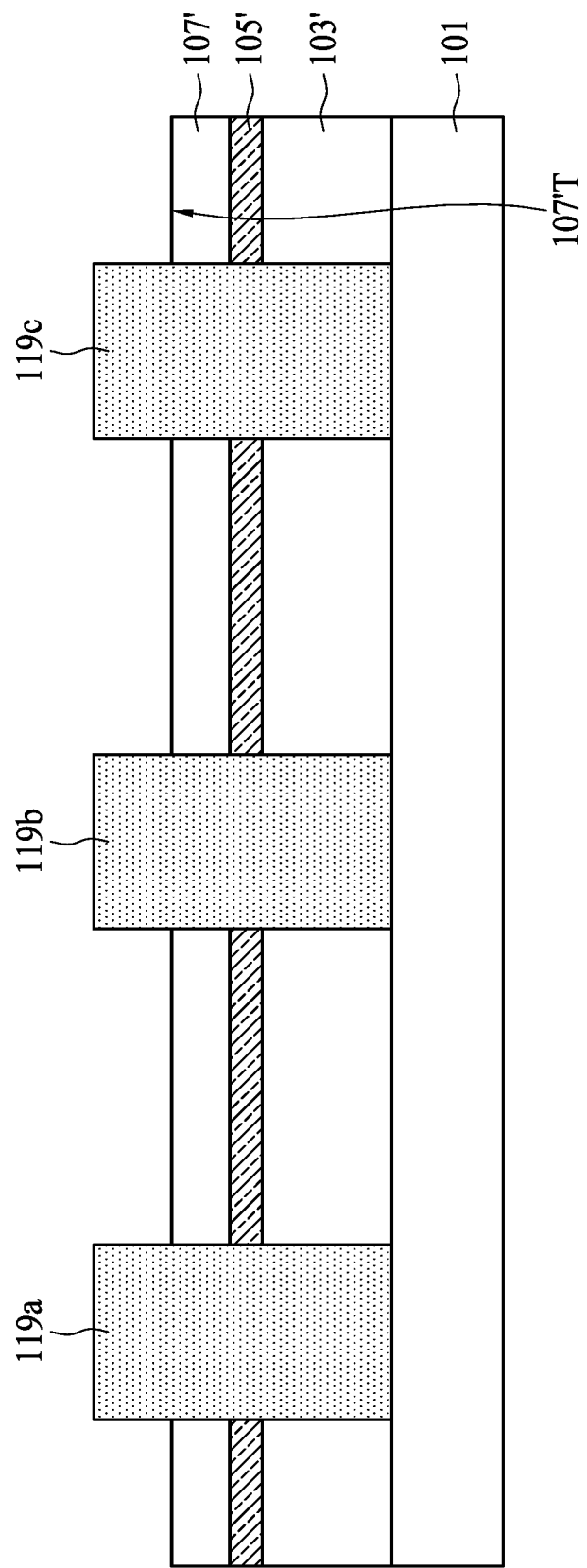
FIG. 9 is a cross-sectional view illustrating an intermediate stage for forming metal plugs in the formation of a semiconductor device, in accordance with some embodiments.

After the metal portions 117a, 117b, 117c are formed, the photoresist pattern 109 is removed, as shown in FIG. 9 in accordance with some embodiments. In some embodiments, the portions of the metal portions 117a, 117b, 117c protruding from atop surface 107'T of the second dielectric layer 107' are slightly etched during the removal process of the photoresist pattern 109, and first metal plugs 119a, 119b, 119c are obtained (i.e., the remaining metal portions 117a, 117b, 117c).

In particular, each of the first metal plugs 119a, 119b, 119c penetrates through the second dielectric layer 107', the etch stop layer 105' and the first dielectric layer 103' to electrically connect to the electronic components in the semiconductor substrate 101, in accordance with some embodiments. The respective step is illustrated as the step S13 in the method 10 shown in FIG. 4. It should be noted that the first metal plugs 119a, 119b, 119c still protrude from the top surface 107'T of the second dielectric layer 107', in accordance with some embodiments.

Figure 10:
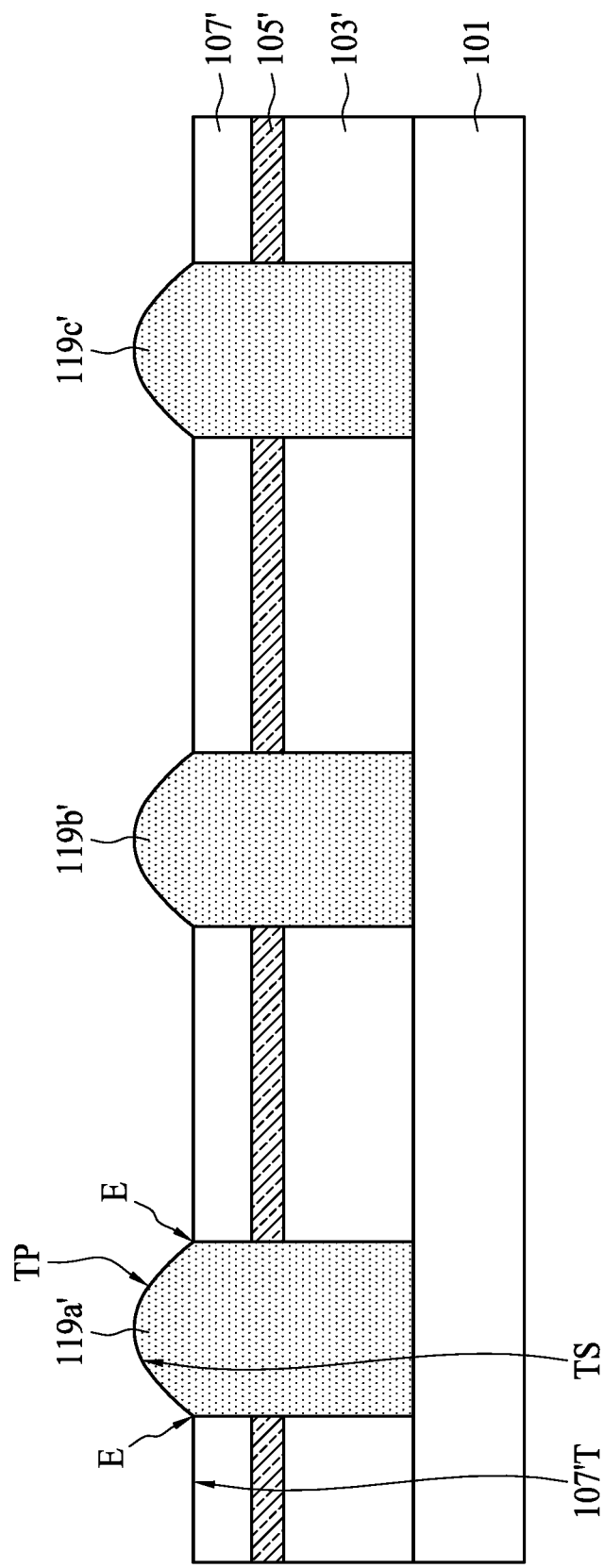
FIG. 10 is a cross-sectional view illustrating an intermediate stage for forming metal plugs with rounded top surfaces in the formation of a semiconductor device, in accordance with some embodiments.

An anisotropic etching process is performed to partially remove the first metal plugs 119a, 119b, 119c such that each of the etched first metal plugs 119a', 119b', 119c' has a rounded (or curved) top surface TS, as illustrated in FIG. 10. In some embodiments, the top surfaces TS of the first metal plugs 119a', 119b', 119c' are convex surfaces. The respective step is illustrated as the step S15 in the method 10 shown in FIG. 4.

As described previously, the topmost points TP of the top surfaces TS of the first metal plugs 119a', 119b', 119c' are higher than the top surface 107'T of the second dielectric layer 107'. More specifically, the edges E of the top surfaces TS are in direct contact with the top surface 107'T of the second dielectric layer 107', in accordance with some embodiments. For the purpose of simplicity and clarity, the top surfaces TS, the topmost points TP and the edges E are indicated only in the first metal plug 119a' of FIG. 10. However, the first metal plugs 119b' and 119c' of FIG. 10 may have features similar to those of the first metal plug 119a'. In some embodiments, the anisotropic etching process is a dry etching process.

Figure 11:
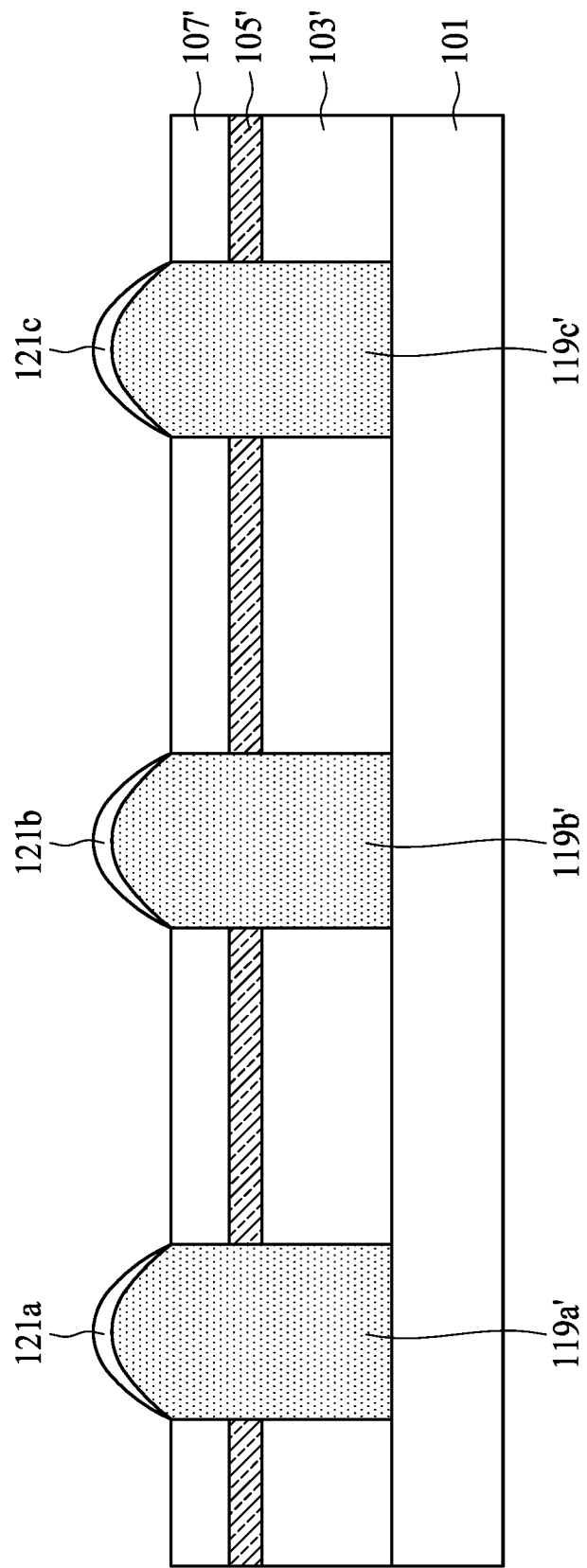
FIG. 11 is a cross-sectional view illustrating an intermediate stage for forming silicide layers in the formation of a semiconductor device, in accordance with some embodiments.

Next, silicide layers 121a, 121b, 121c are disposed over the first metal plugs 119a', 119b' and 119c' by a silicidation process, as shown in FIG. 11 in accordance with some embodiments. In some embodiments, the silicidation process includes a metal material deposition process and an annealing process performed in sequence. In some embodiments, the deposition process of the silicidation process includes a PVD process, an ALD process, or another suitable process. After the annealing process, the unreacted metal material is removed.

In some embodiments, the silicide layers 121a, 121b, 121c are made of one of more of copper silicide, tungsten silicide, cobalt silicide, titanium silicide, nickel silicide, and molybdenum silicide. As described previously, by forming the silicide layers 121a, 121b, 121c, the contact resistance between the first metal plugs 119a', 119b', 119c' and the overlying conductive components (e.g., the second metal plugs 137a, 137b, 137c as shown in FIGS. 1 and 3) may be decreased, thereby improving the performance of the device. In some other embodiments, the silicidation process is not performed and the silicide layers 121a, 121b, 121c are not formed.

Figure 12:
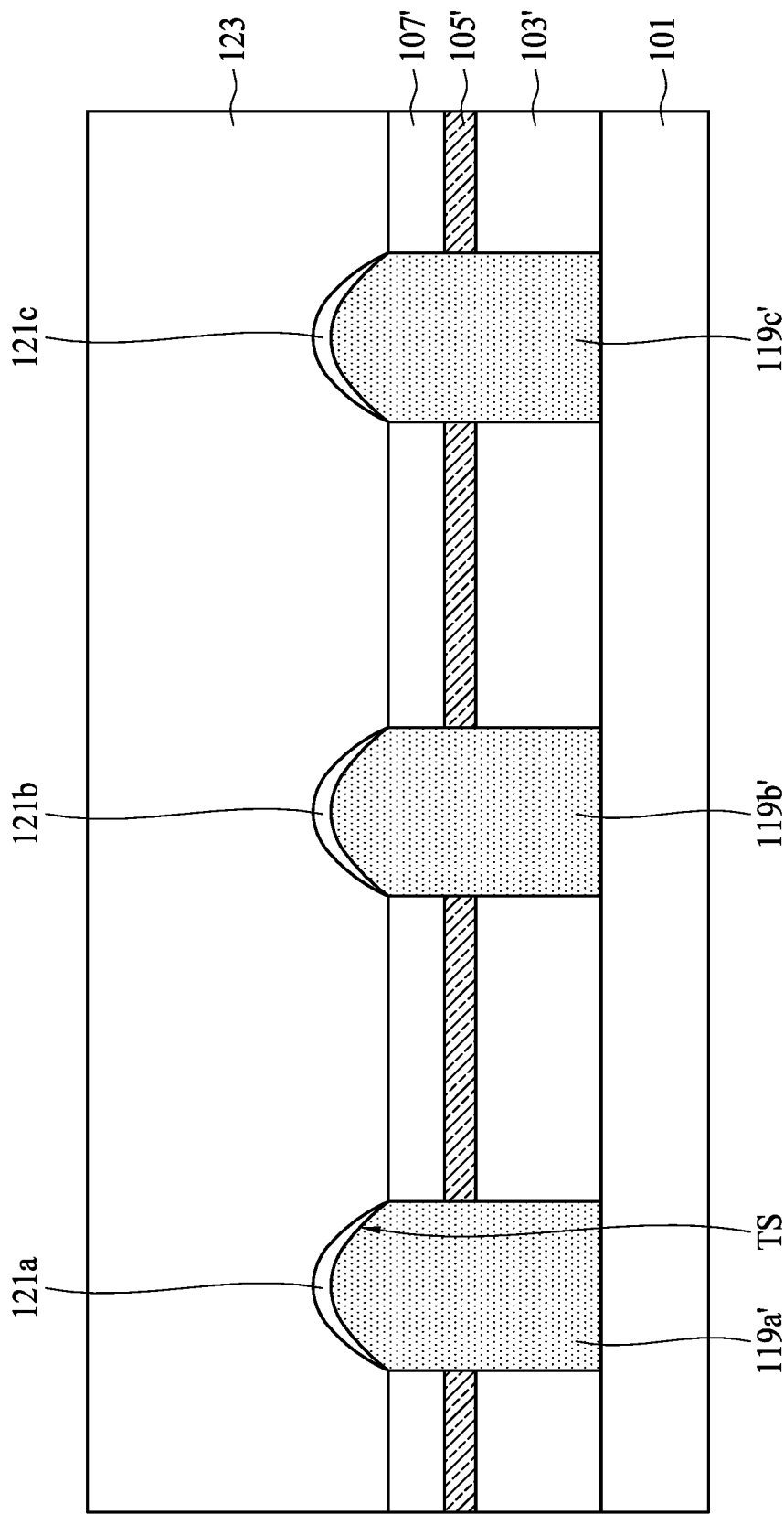
FIG. 12 is a cross-sectional view illustrating an intermediate stage for forming a dielectric layer in the formation of a semiconductor device, in accordance with some embodiments.

The third dielectric layer 123 is formed to cover the second dielectric layer 107' and the first metal plugs 119a', 119b', 119c', as shown in FIG. 12 in accordance with some embodiments. The respective step is illustrated as the step S17 in the method 10 shown in FIG. 4. In some embodiments, the silicide layers 121a, 121b, 121c are covered by the third dielectric layer 123.

It should be noted that the top surfaces TS of the first metal plugs 119a', 119b', 119c' are separated from the third dielectric layer 123 by the silicide layers 121a, 121b, 121c, in accordance with some embodiments. Some materials and processes used to form the third dielectric layer 123 are similar to, or the same as, those used to form the first dielectric layer 103, and descriptions thereof are not repeated herein. It should also be noted that the material of the third dielectric layer 123 is different from the material of the etch stop layer 105', in accordance with some embodiments.

Figure 13:
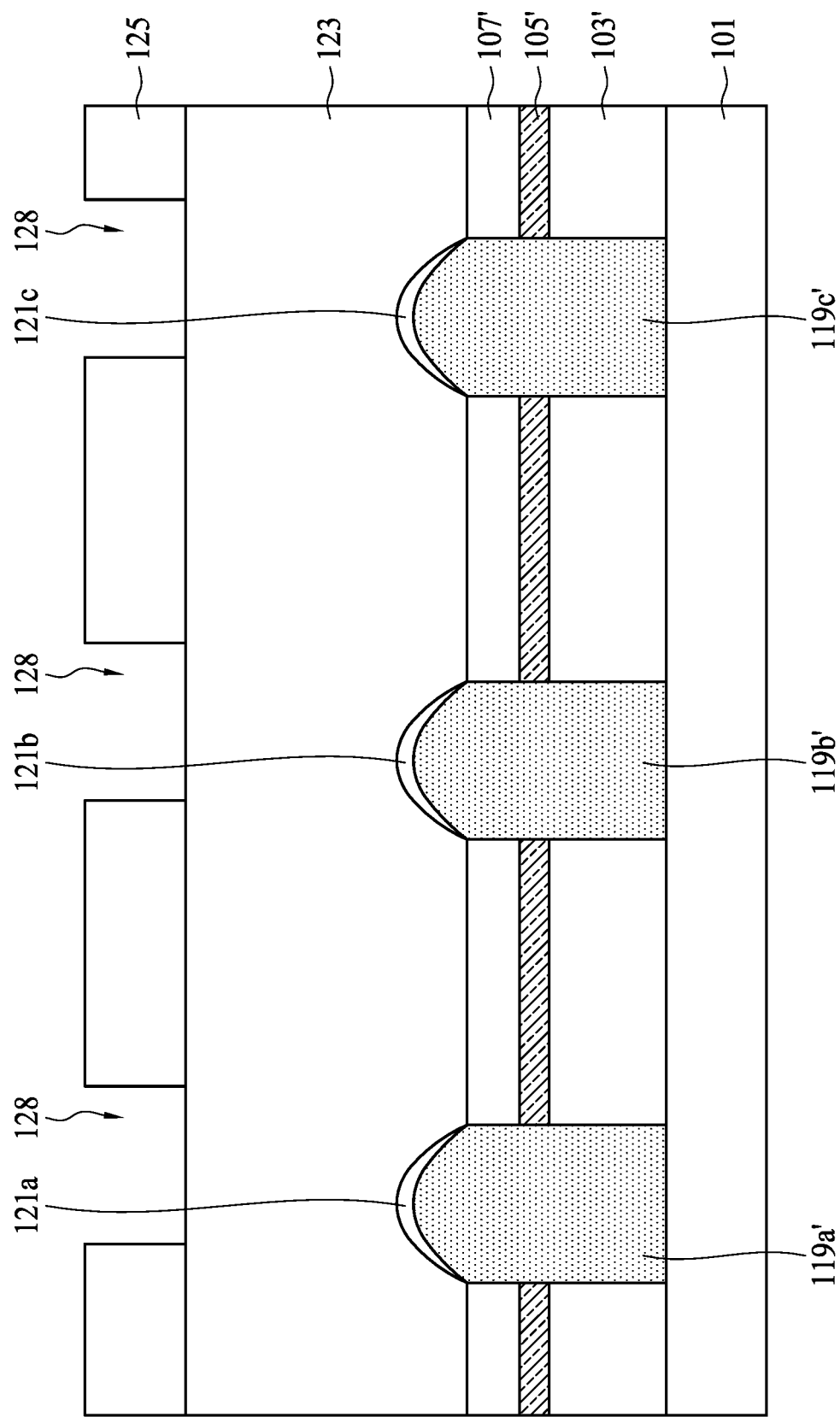
FIG. 13 is a cross-sectional view illustrating an intermediate stage for forming a photoresist pattern in the formation of a semiconductor device, in accordance with some embodiments.

After the third dielectric layer 123 is formed, a photoresist pattern 125 with openings 128 is disposed over the third dielectric layer 123, and the third dielectric layer 123 is exposed by the openings 128, as shown in FIG. 13 in accordance with some embodiments. Some materials and processes used to form the photoresist pattern 125 are similar to, or the same as, those used to form the photoresist pattern 109 of FIG. 5, and descriptions thereof are not repeated herein.

Figure 14:
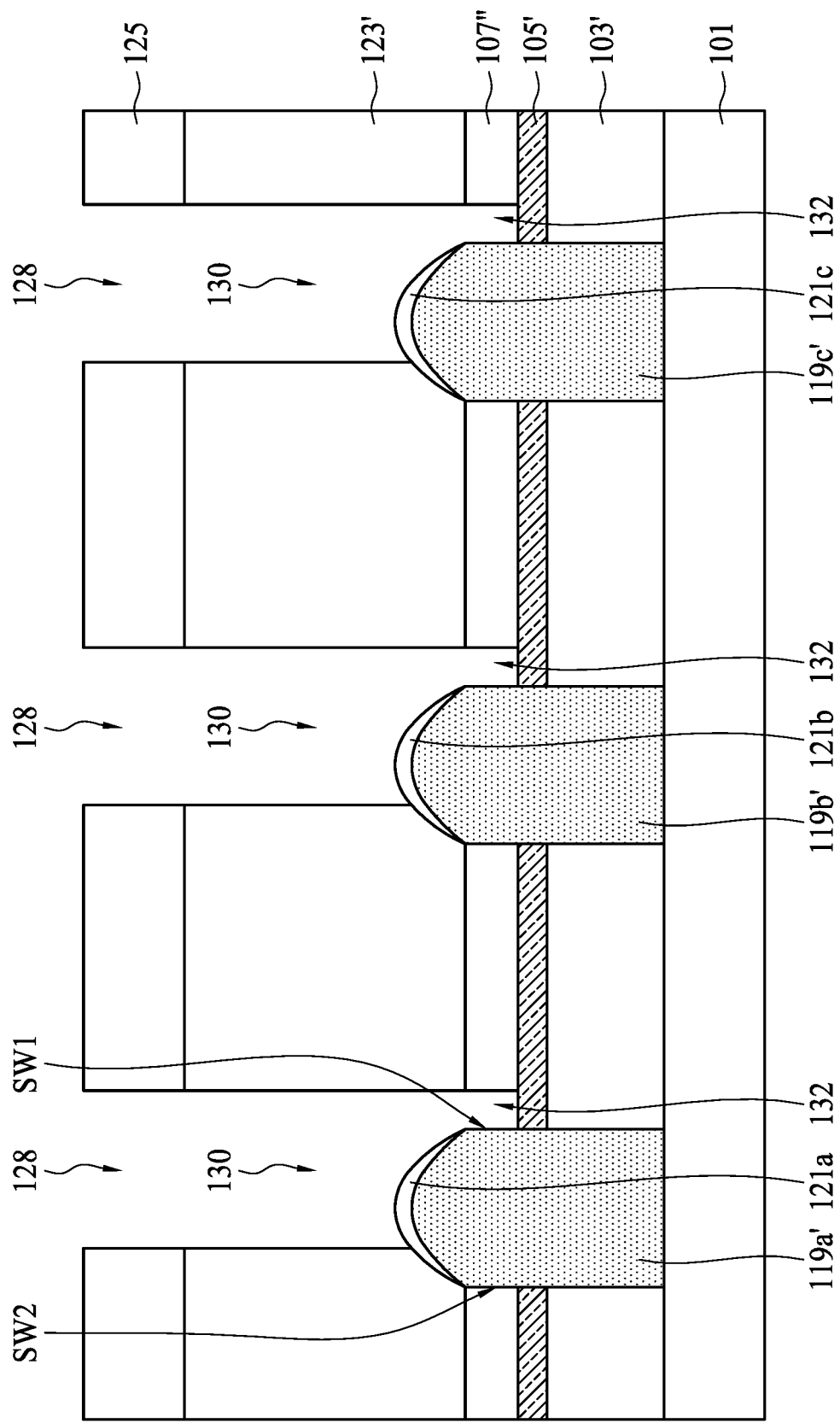
FIG. 14 is a cross-sectional view illustrating an intermediate stage for forming openings and gaps in the formation of a semiconductor device, in accordance with some embodiments.

Next, an etching process is performed on the structure by using the photoresist pattern 125 as a mask, as shown in FIG. 14 in accordance with some embodiments. It should be noted that the etching process is performed until the silicide layers 121a, 121b, 121c or the first metal plugs 119a', 119b', 119c' are exposed, and openings 130 are formed in the remaining third dielectric layer 123' and gaps 132 are formed in the remaining second dielectric layer 107'', in accordance with some embodiments. In addition, the etching process may be a dry etching process, a wet etching process, or a combination thereof.

In some embodiments, the positions of the openings 128 over the second dielectric layer 107' (see FIG. 13), causes the openings 130 to expose portions of the second dielectric layer 107' during the etching process, and the exposed portions of the second dielectric layer 107' are removed to form the gaps 132. It should be noted that the top surface 105'T of the etch stop layer 105' is exposed by the gaps 132, in accordance with some embodiments. As mentioned above, the etch stop layer 105' can protect the underlying electronic components from being exposed during the etching process.

Moreover, each of the first metal plugs 119a', 119b', 119c' has a first sidewall SW1 and a second sidewall SW2 opposite to the first sidewall SW1. In some embodiments, the first sidewalls SW1 are exposed by the gaps 132, and the second sidewalls SW2 remain covered by the second dielectric layer 107''. In some embodiments, portions of the silicide layers 121a, 121b, 121c are sandwiched between the third dielectric layer 123' and the first metal plugs 119a', 119b', 119c' after the openings 130 and the gaps 132 are formed.

Figure 15:
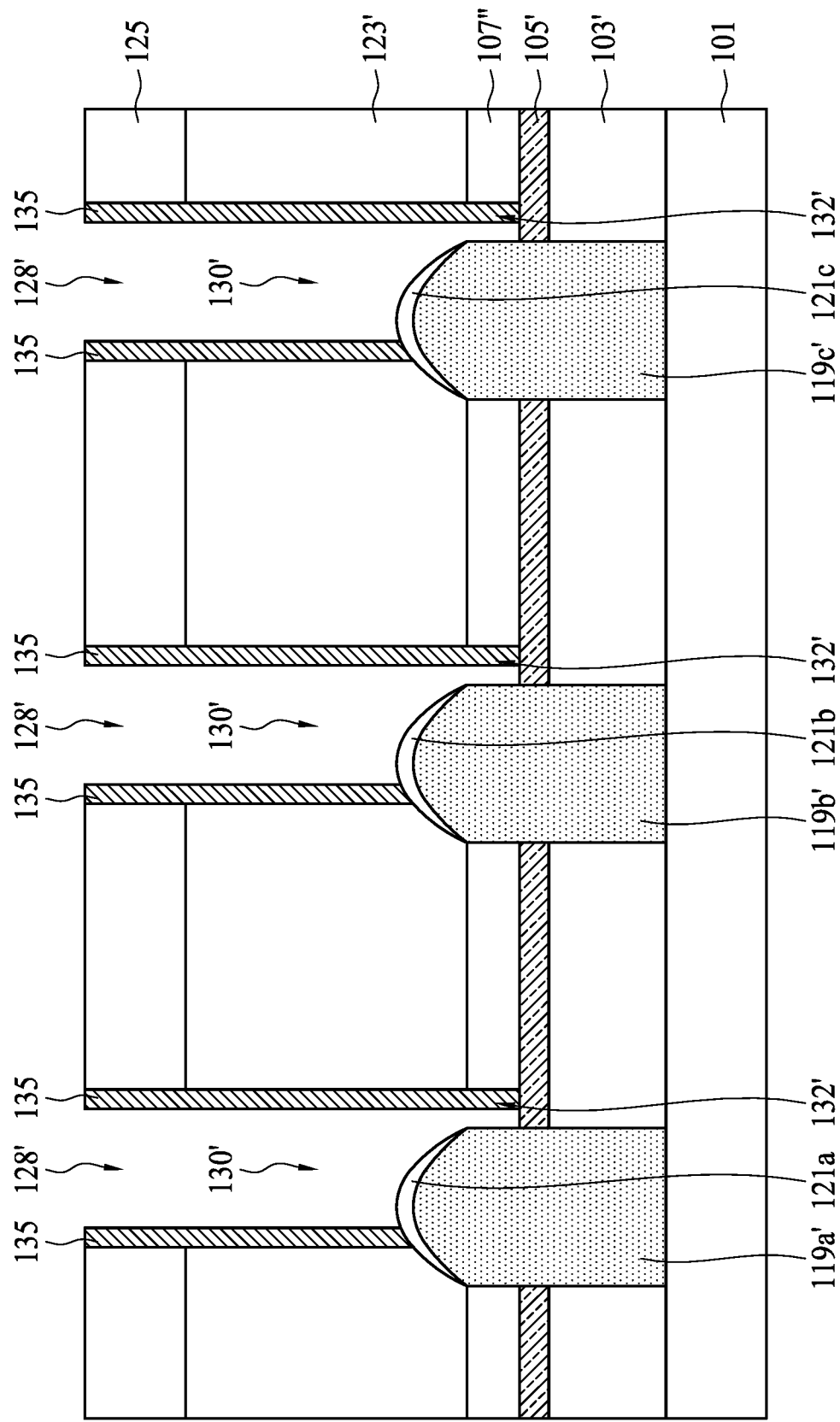
FIG. 15 is a cross-sectional view illustrating an intermediate stage for forming an energy-removable material in the formation of a semiconductor device, in accordance with some embodiments.

An energy-removable material 135 is disposed over sidewalls of the openings 128, 130 and the gaps 132 of FIG. 14, such that reduced openings 128', 130' and reduced gaps 132' are obtained, as shown in FIG. 15 in accordance with some embodiments.

In some embodiments, the energy-removable material 135 includes a thermal-decomposable material. In some other embodiments, the energy-removable material 135 includes a photonic-decomposable material, an e-beam decomposable material, or another suitable energy-decomposable material. Specifically, in some embodiments, the energy-removable material 135 includes a base material and a decomposable porogen material that is substantially removed upon exposure to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can, in the subsequent processes, provide porosity to the space previously occupied by the energy-removable material 135.

In some embodiments, the energy-removable material 135 is formed by a deposition process and an etching process. In some embodiments, the deposition process includes CVD, PVD, ALD, spin coating, or another suitable process, and the etching process includes a reactive ion etching (RIE) process, which is used to remove the excess portions over the photoresist pattern 125.

Figure 16:
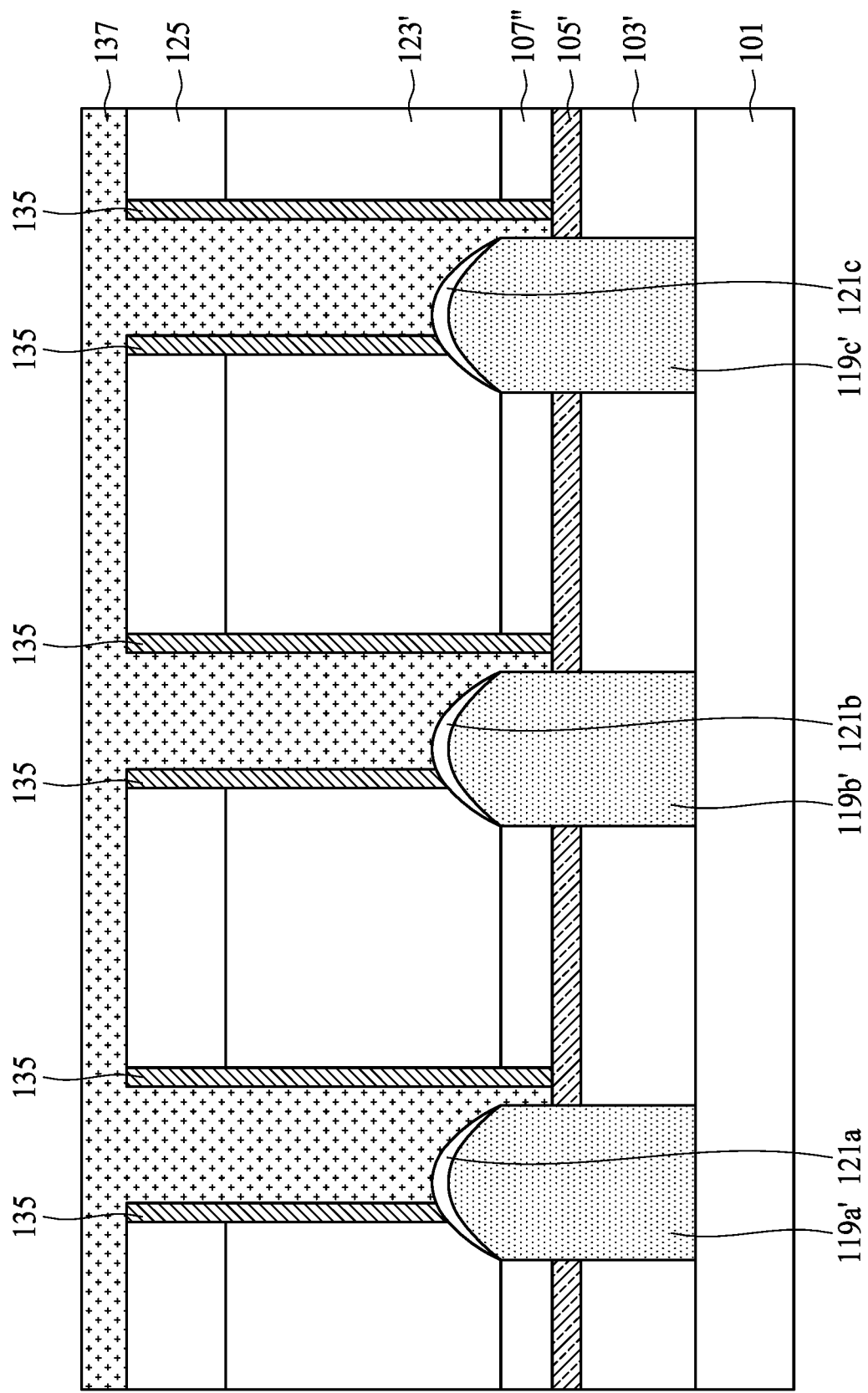
FIG. 16 is a cross-sectional view illustrating an intermediate stage for forming a metal layer in the formation of a semiconductor device, in accordance with some embodiments.

Next, the openings 128' and 130' and the gaps 132' are filled by a metal layer 137, and the metal layer 137 extends onto the photoresist pattern 125, as shown in FIG. 16 in accordance with some embodiments. It should be noted that the metal layer 137 is in direct contact with the first metal plugs 119a', 119b', 119c' and the etch stop layer 105'.

In some embodiments, the metal layer 137 is made of copper (Cu). In some other embodiments, the metal layer 137 is made of tungsten (W), cobalt (Co), titanium (Ti), aluminum (Al), tantalum (Ta), or another applicable material. Moreover, in some embodiments, the metal layer 137 is formed by a CVD process, a PVD process, an ALD process, a plating (e.g., electroplating) process, a sputtering process, or another suitable process.

Figure 17:
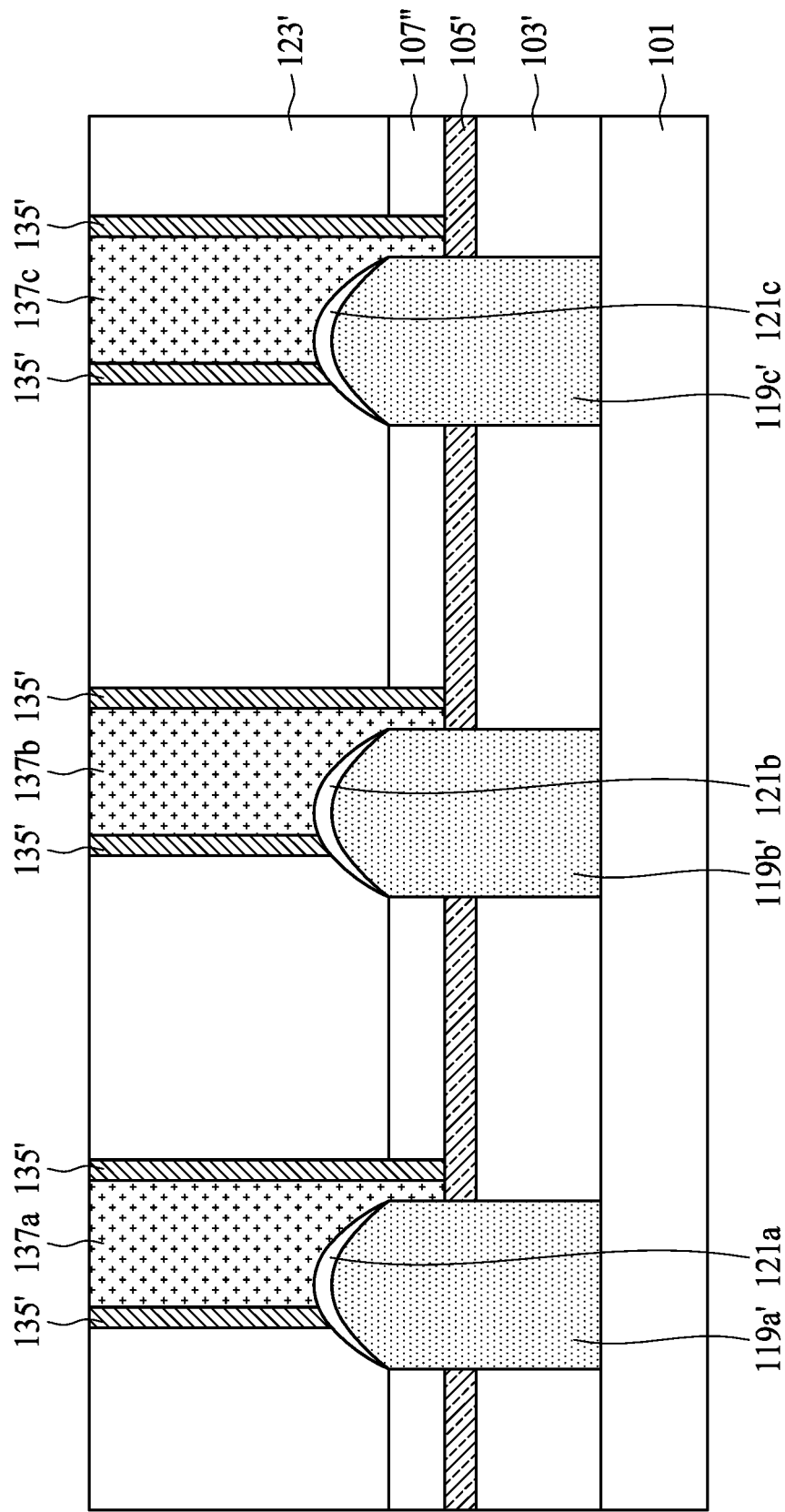
FIG. 17 is a cross-sectional view illustrating an intermediate stage for forming energy-removable layers and metal plugs in the formation of a semiconductor device, in accordance with some embodiments.

Next, a planarization process is performed to remove the photoresist pattern 125 and the excess portions of the metal layer 137 and the energy-removable material 135 above the third dielectric layer 123', as shown in FIG. 17 in accordance with some embodiments. The planarization process may be a CMP process. After the planarization process, the second metal plugs 137a, 137b, 137c, and the energy-removable layers 135' are obtained. The respective step is illustrated as the step S19 in the method 10 shown in FIG. 4.

It should be noted that the second metal plugs 137a, 137b, 137c are disposed over and are electrically connected to the first metal plugs 119a', 119b', 119c', respectively, and the energy-removable layers 135' are located between the second metal plugs 137a, 137b, 137c and the third dielectric layer 123', in accordance with some embodiments.

Figure 18:
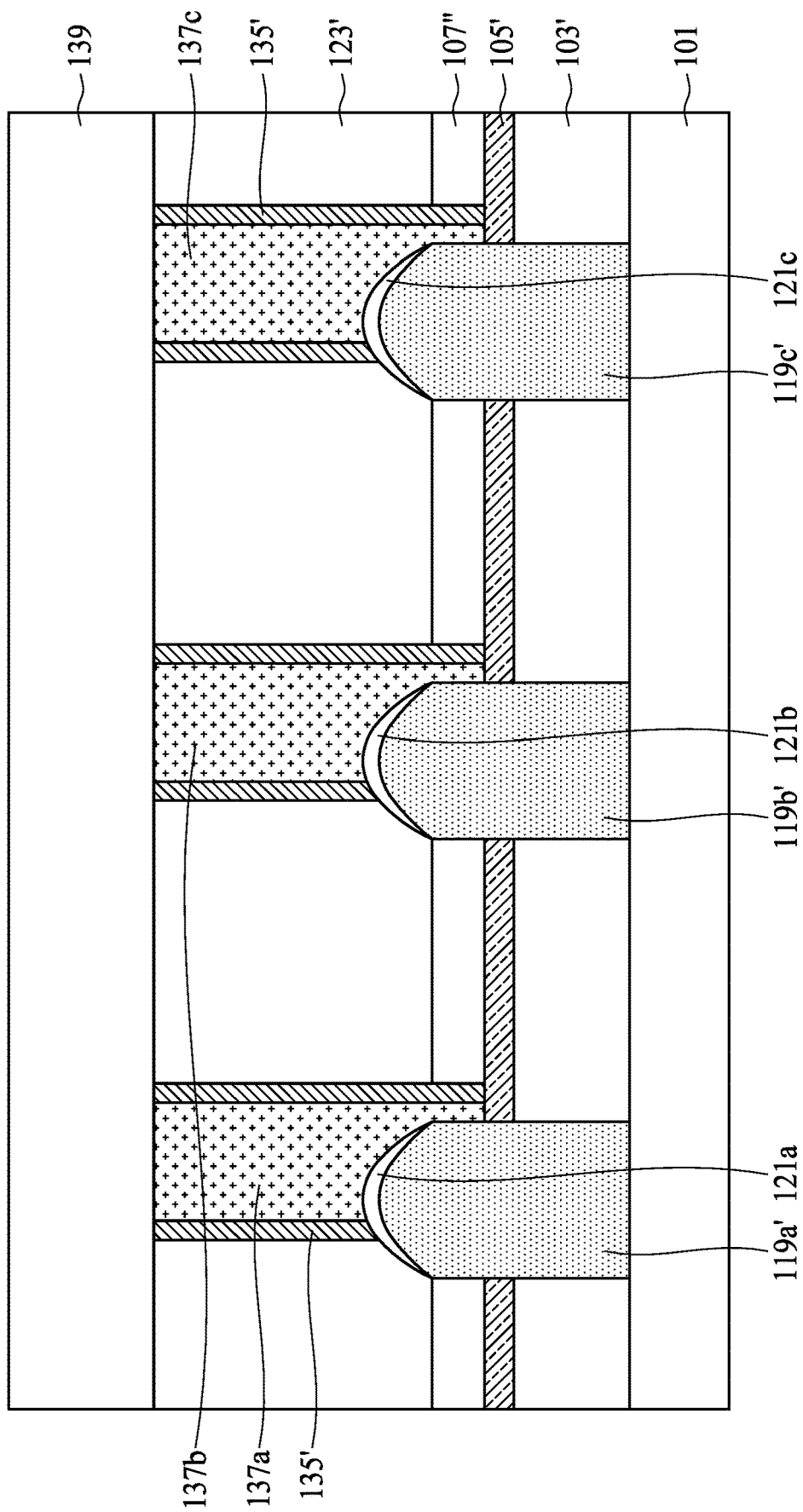
FIG. 18 is a cross-sectional view illustrating an intermediate stage for forming a dielectric layer in the formation of a semiconductor device, in accordance with some embodiments.

After the second metal plugs 137a, 137b, 137c are formed, a fourth dielectric layer 139 is formed covering the third dielectric layer 123', the energy-removable layers 135' and the second metal plugs 137a, 137b, 137c, as shown in FIG. 18 in accordance with some embodiments. Some materials and processes used to form the fourth dielectric layer 139 are similar to, or the same as, those used to form the first dielectric layer 103, and descriptions thereof are not repeated herein.

Figure 19:
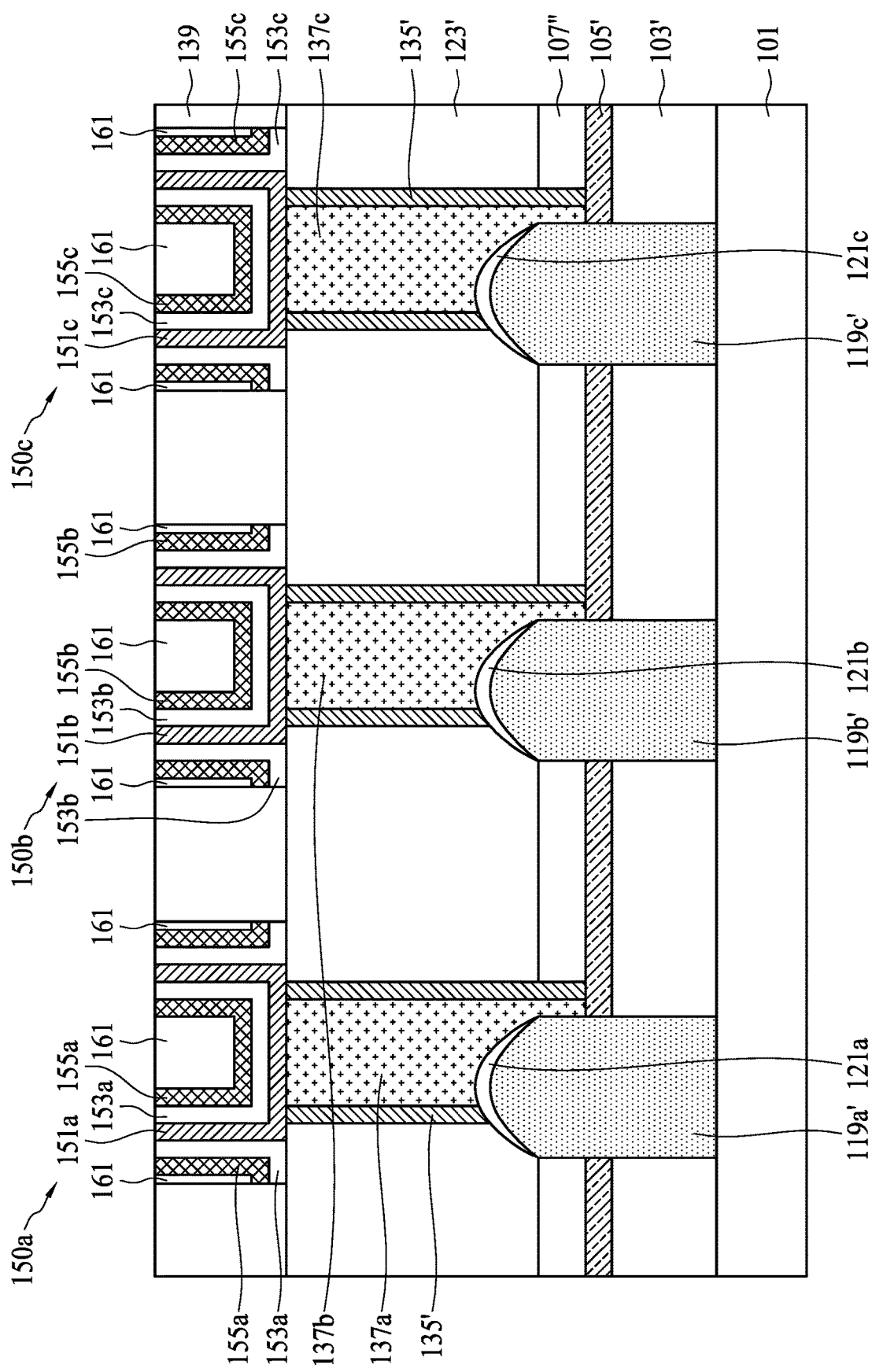
FIG. 19 is a cross-sectional view illustrating an intermediate stage for forming metal-insulator-metal capacitors in the formation of a semiconductor device, in accordance with some embodiments.

The MIM capacitors 150a, 150b, 150c are formed in the fourth dielectric layer 139, as shown in FIG. 19 in accordance with some embodiments. In some embodiments, the metal layers 151a, 151b, 151c are U-shaped, and the energy-removable layers 135' and the second metal plugs 137a, 137b, 137c are covered by the corresponding metal layers 151a, 151b, 151c. Moreover, in some embodiments, the metal layers 151a, 151b, 151c are surrounded by the insulating layers 153a, 153b, 153c, respectively, and the insulating layers 153a, 153b, 153c are surrounded by the metal layers 155a, 155b, 155c, respectively. Furthermore, the remaining space within each of the MIM capacitors 150a, 150b, 150c may be filled by the filling dielectric layer 161.

Some materials and processes used to form the metal layers 151a, 151b, 151c and the metal layers 155a, 155b, 155c are similar to, or the same as, those used to form the second metal plugs 137a, 137b, 137c, and descriptions thereof are not repeated herein. Some materials and processes used to form the insulating layers 153a, 153b, 153c and the filling dielectric layer 161 are similar to, or the same as, those used to form the first dielectric layer 103, and descriptions thereof are not repeated herein. In some embodiments, the filling dielectric layer 161 and the fourth dielectric layer 139 are made of the same material, and no obvious interface exists between the filling dielectric layer 161 and the fourth dielectric layer 139.

After the MIM capacitors 150a, 150b, 150c are formed, a heat treatment is used to remove the decomposable porogen material of the energy-removable layers 135' to generate pores, and the pores are filled by air such that the air gaps 136a1, 136a2, 136b1, 136b2, 136c1, 136c2 are obtained between the second metal plugs 137a, 137b, 137c and the third dielectric layer 123', as shown in FIG. 1 in accordance with some embodiments.

In some other embodiments, the heat treatment process can be replaced by a light treatment process, an e-beam treatment process, a combination thereof, or another applicable energy treatment process. For example, an ultraviolet (UV) light or laser light may be used to remove the decomposable porogen material of the energy-removable layers 135', such that the air gaps 136a1, 136a2, 136b1, 136b2, 136c1, 136c2 are obtained.

As described previously, since the dielectric constant of air is relatively low, the parasitic capacitance between the second metal plugs 137a, 137b, 137c may be reduced, thereby improving the operation speed of the semiconductor device 100a. In some other embodiments, the energy-removable layers 135' and the air gaps 136a1, 136a2, 136b1, 136b2, 136c1, 136c2 are not formed. In these cases, the second metal plugs 137a, 137b, 137c may be in direct contact with the third dielectric layer 123'.

Figure 20:
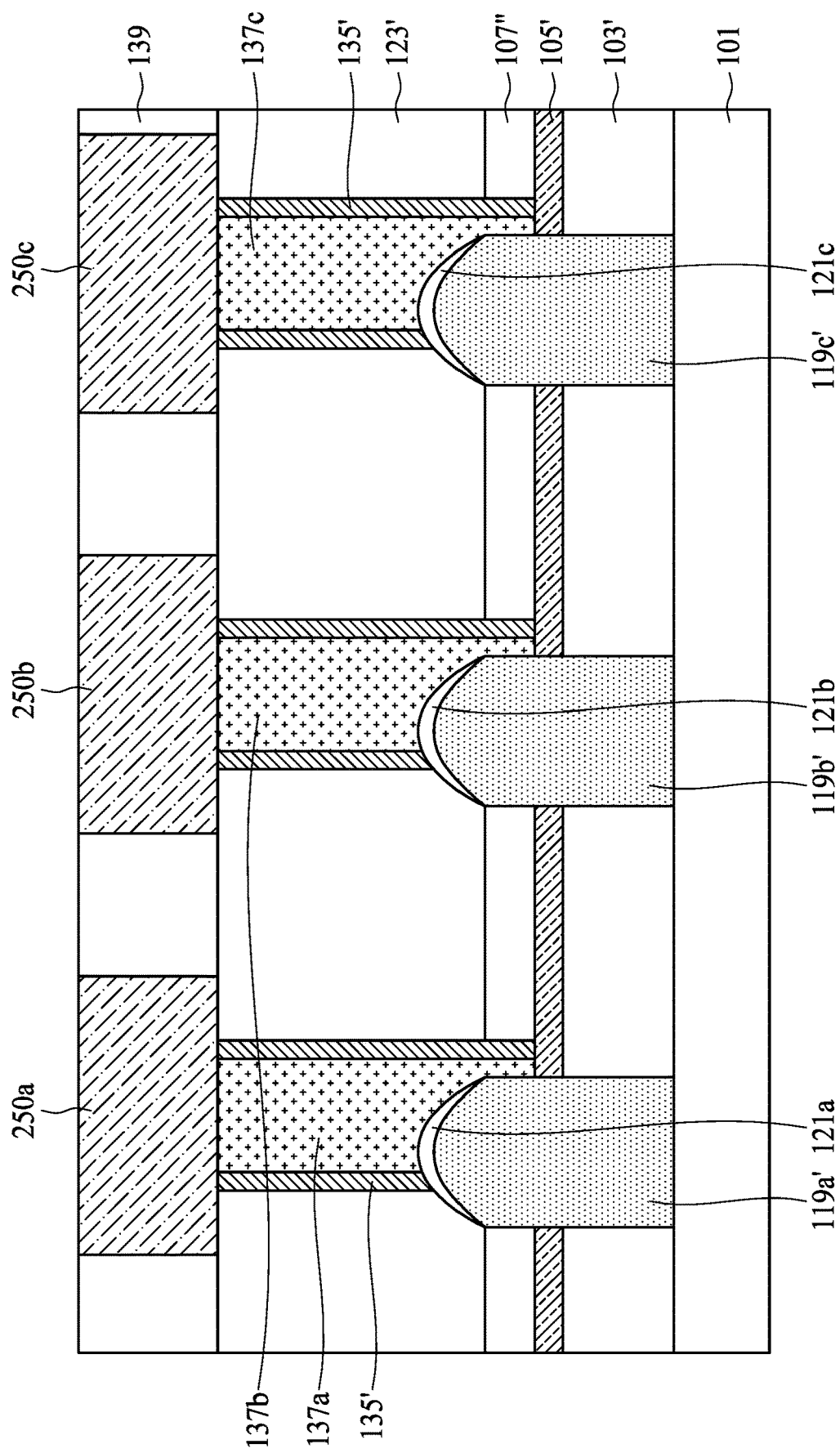
FIG. 20 is a cross-sectional view illustrating an intermediate stage for forming bit lines in the formation of a semiconductor device, in accordance with some embodiments.

In an alternative embodiment, the bit lines 250a, 250b, 250c are formed in the fourth dielectric layer 139, as shown in FIG. 20 in accordance with some embodiments. In some embodiments, the energy-removable layers 135' and the second metal plugs 137a, 137b, 137c are covered by the corresponding bit lines 250a, 250b, 250c. Some materials and processes used to form the bit lines 250a, 250b, 250c are similar to, or the same as, those used to form the second metal plugs 137a, 137b, 137c, and descriptions thereof are not repeated herein.

After the bit lines 250a, 250b, 250c are formed, the air gaps 136a1, 136a2, 136b1, 136b2, 136c1, 136c2 are formed by the process described above, as shown in FIG. 3 in accordance with some embodiments. After the air gaps 136a1, 136a2, 136b1, 136b2, 136c1, 136c2 are formed, the semiconductor device 100b is obtained. In some other embodiments, the air gaps 136a1, 136a2, 136b1, 136b2, 136c1, 136c2 of the semiconductor device 100b are not formed.

Embodiments of the semiconductor devices 100a, 100b and methods for forming the same are provided. The semiconductor devices 100a and 100b include the first metal plugs 119a', 119b', 119c' and the second metal plugs 137a, 137b, 137c over the first metal plugs 119a', 119b', 119c'. Because the first metal plugs 119a', 119b', 119c' have rounded (or curved) top surfaces TS, the contact areas between the first metal plugs 119a', 119b', 119c' and the second metal plugs 137a, 137b, 137c (or the contact areas between the silicide layers 121a, 121b, 121c and the second metal plugs 137a, 137b, 137c) are increased, compared with arrangements in which the first metal plugs 119a', 119b', 119c' have flat top surfaces and the second metal plugs 137a, 137b, 137c are perfectly aligned with the first metal plugs 119a', 119b', 119c'. The increased contact areas of the rounded top surfaces TS may cause a corresponding decrease of the resistances between the first metal plugs 119a', 119b', 119c' and the second metal plugs 137a, 137b, 137c, thereby improving the overall device performance.

Moreover, the electric field strengths on the rounded top surfaces TS of the first metal plugs 119a', 119b', 119c' are evenly distributed, since the first metal plugs 119a', 119b', 119c' have no sharp portions. Therefore, the lifespan of the semiconductor devices 100a and 100b may be extended significantly, and the performance and reliability of the devices may be improved.

Furthermore, because the etch stop layer 105' adjoins sidewalls of the first metal plugs 119a', 119b', 119c', the underlying electronic components can be prevented from being exposed during the processes for forming the second metal plugs 137a, 137b, 137c, and the issues caused by misalignment between the first metal plugs 119a', 119b', 119c' and the second metal plugs 137a, 137b, 137c may be prevented or reduced.

In one embodiment of the present disclosure, a semiconductor device is provided. The semiconductor device includes a first metal plug and an etch stop layer disposed over a semiconductor substrate. The first metal plug has an upper portion protruding from a top surface of the etch stop layer, and a top surface of the upper portion is rounded. The semiconductor device also includes a second metal plug disposed over the first metal plug. The second metal plug is in direct contact with a first sidewall of the upper portion of the first metal plug and the top surface of the etch stop layer.

In some embodiments, the semiconductor device further includes a first dielectric layer disposed between the semiconductor substrate and the etch stop layer. The first dielectric layer and the etch stop layer surround a lower portion of the first metal plug. In some embodiments, the semiconductor device further includes a second dielectric layer disposed over the etch stop layer. The upper portion of the first metal plug has a second sidewall opposite to the first sidewall, and the second dielectric layer is in direct contact with the second sidewall. In some embodiments, the second dielectric layer is separated from the first sidewall of the upper portion of the first metal plug. In some embodiments, a height of the first sidewall is substantially the same as a height of the second dielectric layer. In some embodiments, the semiconductor device further includes a third dielectric layer disposed over the second dielectric layer. The third dielectric layer partially covers the upper portion of the first metal plug. In some embodiments, the semiconductor device further includes a silicide layer disposed between the first metal plug and the second metal plug. The top surface of the upper portion of the first metal plug is separated from the second metal plug by the silicide layer.

In another embodiment of the present disclosure, a semiconductor device is provided. The semiconductor device includes a first metal plug and a first dielectric layer disposed over a semiconductor substrate. The semiconductor device also includes an etch stop layer disposed over the first dielectric layer. The first metal plug has an upper portion protruding from the etch stop layer, the upper portion has a convex top surface, and the etch stop layer adjoins a lower portion of the first metal plug. The semiconductor device further includes a second dielectric layer disposed over the etch stop layer, and a topmost point of the convex top surface is higher than a top surface of the second dielectric layer. In addition, the semiconductor device includes a second metal plug disposed over the first metal plug. The second metal plug extends to contact a top surface of the etch stop layer.

In some embodiments, the convex top surface is between a first sidewall and a second sidewall of the upper portion of the first metal plug, and the first sidewall is in direct contact with the second metal plug. In some embodiments, the second sidewall of the upper portion of the first metal plug is in direct contact with the second dielectric layer. In some embodiments, the semiconductor device further includes a third dielectric layer disposed over the second dielectric layer, and a silicide layer disposed between the upper portion of the first metal plug and the second metal plug. The silicide layer extends between the convex top surface of the upper portion of the first metal plug and the third dielectric layer. In some embodiments, the second metal plug and the second dielectric layer are separated by an air gap. In some embodiments, the semiconductor device further includes a metal-insulator-metal capacitor disposed over the second metal plug. The metal-insulator-metal capacitor is electrically connected to the first metal plug through the second metal plug. In some embodiments, the semiconductor device further includes a bit line disposed over the second metal plug. The bit line is electrically connected to the first metal plug through the second metal plug.

In one embodiment of the present disclosure, a method for preparing a semiconductor device is provided. The method includes forming a first dielectric layer over a semiconductor substrate, and forming an etch stop layer over the first dielectric layer. The method also includes forming a second dielectric layer over the etch stop layer, and forming a first metal plug penetrating through the second dielectric layer, the etch stop layer and the first dielectric layer. The first metal plug protrudes from the second dielectric layer. The method further includes performing an anisotropic etching process to partially remove the first metal plug such that the first metal plug has a convex top surface, and forming a third dielectric layer covering the second dielectric layer and the convex top surface of the first metal plug. In addition, the method includes forming a second metal plug over the first metal plug. The second metal plug penetrates through the third dielectric layer and extends to contact the etch stop layer.

In some embodiments, after the anisotropic etching process is performed, an edge of the convex top surface of the first metal plug is in direct contact with a top surface of the second dielectric layer. In some embodiments, the method further includes performing, before the third dielectric layer is formed, a silicidation process to form a silicide layer over the convex top surface of the first metal plug. In some embodiments, after the second metal plug is formed, a portion of the silicide layer is sandwiched between the third dielectric layer and the first metal plug. In some embodiments, the step of forming the second metal plug further includes forming an opening in the third dielectric layer and forming a gap in the second dielectric layer to partially expose the etch stop layer, and forming the second metal plug in the opening and in the gap. The first metal plug has a first sidewall and a second sidewall opposite to the first sidewall, the first sidewall is exposed by the gap, the second sidewall is covered by the second dielectric layer, and the second metal plug is in direct contact with the first sidewall. In some embodiments, the method further includes forming an energy-removable layer between the second metal plug and the third dielectric layer, forming a conductive layer over the second metal plug, and performing a heat treatment process to transform the energy-removable layer into an air gap. The energy-removable layer is covered by the conductive layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a first dielectric layer over a semiconductor substrate;
    forming an etch stop layer over the first dielectric layer;
    forming a second dielectric layer over the etch stop layer;
    forming a first metal plug penetrating through the second dielectric layer, the etch stop layer and the first dielectric layer, wherein the first metal plug protrudes from the second dielectric layer;
    performing an anisotropic etching process to partially remove the first metal plug such that the first metal plug has a convex top surface;
    forming a third dielectric layer covering the second dielectric layer and the convex top surface of the first metal plug; and
    forming a second metal plug over the first metal plug, wherein the second metal plug penetrates through the third dielectric layer and extends to contact the etch stop layer.

2. The method for preparing a semiconductor device of claim 1, wherein, after the anisotropic etching process, an edge of the convex top surface of the first metal plug is in direct contact with a top surface of the second dielectric layer.

3. The method for preparing a semiconductor device of claim 1, further comprising:
    performing a silicidation process to form a silicide layer over the convex top surface of the first metal plug before the third dielectric layer is formed.

4. The method for preparing a semiconductor device of claim 3, wherein a portion of the silicide layer is sandwiched between the third dielectric layer and the first metal plug after the second metal plug is formed.

5. The method for preparing a semiconductor device of claim 1, wherein the step of forming the second metal plug further comprises:
    forming an opening in the third dielectric layer and a gap in the second dielectric layer to partially expose the etch stop layer, wherein the first metal plug has a first sidewall and a second sidewall opposite to the first sidewall, the first sidewall is exposed by the gap, and the second sidewall is covered by the second dielectric layer; and
    forming the second metal plug in the opening and the gap such that the second metal plug is in direct contact with the first sidewall.

6. The method for preparing a semiconductor device of claim 1, further comprising:
    forming an energy-removable layer between the second metal plug and the third dielectric layer;
    forming a conductive layer over the second metal plug, wherein the energy-removable layer is covered by the conductive layer; and
    performing a heat treatment process to transform the energy-removable layer into an air gap.

7. The method for preparing a semiconductor device of claim 1, further comprising:
   a metal-insulator-metal capacitor disposed over the second metal plug, wherein the metal-insulator-metal capacitor is electrically connected to the first metal plug through the second metal plug.

8. The method for preparing a semiconductor device of claim 1, further comprising:
   a bit line disposed over the second metal plug, wherein the bit line is electrically connected to the first metal plug through the second metal plug.

\* \* \* \* \*